United States Patent
Kitamura

(10) Patent No.: US 9,680,034 B2
(45) Date of Patent: Jun. 13, 2017

(54) MANUFACTURING METHOD FOR SEMICONDUCTOR DEVICE WITH POINT DEFECT REGION DOPED WITH TRANSITION METAL

(71) Applicant: FUJI ELECTRIC CO., LTD., Kawasaki-shi (JP)

(72) Inventor: Shoji Kitamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/084,659

(22) Filed: Mar. 30, 2016

(65) Prior Publication Data

US 2016/0211385 A1   Jul. 21, 2016

Related U.S. Application Data

(62) Division of application No. 13/962,218, filed on Aug. 8, 2013, now Pat. No. 9,337,282.

(30) Foreign Application Priority Data

Sep. 12, 2012   (JP) .................................. 2012-201029

(51) Int. Cl.
  *H01L 29/36* (2006.01)
  *H01L 29/868* (2006.01)
  (Continued)

(52) U.S. Cl.
  CPC ............ *H01L 29/868* (2013.01); *H01L 21/22* (2013.01); *H01L 21/221* (2013.01);
  (Continued)

(58) Field of Classification Search
  CPC ......... H01L 29/36; H01L 21/22; H01L 29/66; H01L 29/861; H01L 21/263; H01L 21/3105; H01L 29/868
  (Continued)

(56) References Cited

U.S. PATENT DOCUMENTS 6,225,176 B1   5/2001   Yu
6,828,690 B1   12/2004   Falster
(Continued)

FOREIGN PATENT DOCUMENTS

JP   04125933 A   4/1992
JP   2002231968 A   8/2002
(Continued)

OTHER PUBLICATIONS

J. Vobecky, et al "Fast Recovery Radiation Enhanced Diffusion (RED) Diode: Palladium versus Platinum" 13th European Conference on Power Electronics and Applications 2009: EPE 2009 (Barcelona), Oct. 2009, pp. 1-8.
(Continued)

*Primary Examiner* — Selim Ahmed
(74) *Attorney, Agent, or Firm* — Rossi, Kimms & McDowell LLP

(57) ABSTRACT

A simplified manufacturing process stably produces a semiconductor device with high electrical characteristics, wherein platinum acts as an acceptor. Plasma treatment damages the surface of an oxide film formed on a $n^-$ type drift layer deposited on an $n^+$ type semiconductor substrate. The oxide film is patterned to have tapered ends. Two proton irradiations are carried out on the $n^-$ type drift layer with the oxide film as a mask to form a point defect region in the vicinity of the surface of the $n^-$ type drift layer. Silica paste containing 1% by weight platinum is applied to an exposed region of the $n^-$ type drift layer surface not covered with the oxide film. Heat treatment inverts the vicinity of the surface of the $n^-$ type drift layer to p-type by platinum atoms which are acceptors. A p-type inversion enhancement region forms a p-type anode region.

14 Claims, 27 Drawing Sheets

(51) Int. Cl.
*H01L 21/22* (2006.01)
*H01L 21/263* (2006.01)
*H01L 29/66* (2006.01)
*H01L 29/861* (2006.01)
*H01L 21/3105* (2006.01)
*H01L 21/311* (2006.01)
*H01L 21/225* (2006.01)
*H01L 29/06* (2006.01)

(52) U.S. Cl.
CPC .......... *H01L 21/225* (2013.01); *H01L 21/263* (2013.01); *H01L 21/3105* (2013.01); *H01L 21/31111* (2013.01); *H01L 29/063* (2013.01); *H01L 29/36* (2013.01); *H01L 29/6609* (2013.01); *H01L 29/66136* (2013.01); *H01L 29/66204* (2013.01); *H01L 29/861* (2013.01)

(58) Field of Classification Search
USPC .... 257/46, 607, E21.358, E29.012, E29.327
See application file for complete search history.

(56) References Cited

U.S. PATENT DOCUMENTS

| | | |
|---|---|---|
| 2002/0158246 A1 | 10/2002 | Kitamura et al. |
| 2010/0025827 A1 | 2/2010 | Fujii |
| 2012/0032305 A1* | 2/2012 | Kitamura .............. H01L 29/167 257/607 |

FOREIGN PATENT DOCUMENTS

| | | |
|---|---|---|
| JP | 2003282575 A | 10/2003 |
| JP | 2004088012 A | 3/2004 |
| JP | 3952452 B2 | 8/2007 |
| JP | 2008004704 A | 1/2008 |
| JP | 2009239269 A | 10/2009 |
| JP | 2012038810 A | 2/2012 |

OTHER PUBLICATIONS

D. Hu, et al, "Effect of Proton Irradiation Dose on the Gettering Efficiency of Platinum and the Performance of Local Lifetime-Controlled Power Diodes", Japanese Journal of Applied Physics, 2007, vol. 46, No. 2, pp. 566-568.

J. Vobecky, et al "The Radiation Enhanced Diffusion (RED) Diode Realization of a Large Area p+p−n−n+ Structure with High SOA", IEEE 21st International Symposium on Power Semiconductor Devices & IC's 2009: ISPSD 2009 (Barcelona), Jun. 2009, pp. 144-147.

Office Action issued in U.S Appl. No. 13/962,218, mailed Jan. 23, 2015.

Office Action issued in U.S Appl. No. 13/962,218, mailed Jul. 30, 2015.

Notice of Allowance issued in U.S. Appl. No. 13/962,218, mailed Feb. 2, 2016.

Office Action issued in Japanese Appln. No. 2012-201029 mailed Jul. 12, 2016. English translation provided.

* cited by examiner

MANUFACTURING METHOD FOR SEMICONDUCTOR DEVICE WITH POINT DEFECT REGION DOPED WITH TRANSITION METAL

BACKGROUND OF THE INVENTION

A. Field of the Invention

The present invention relates to a semiconductor device and semiconductor device manufacturing method.

B. Description of the Related Art

Rectifier diodes utilizing a silicon (Si) semiconductor p-n junction are known. In particular, high speed recovery diodes in which reverse recovery time is improved are widely used in high frequency switching applications. A diode is configured of a p-type anode layer, an $n^+$ type cathode layer, and an $n^-$ type drift layer provided between the p-type anode layer and $n^+$ type cathode layer in order to maintain high breakdown voltage, and exhibits rectifying characteristics using a p-n junction of the p-type anode layer and $n^-$ type drift layer.

As the $n^-$ type drift layer has an impurity concentration lower than that of the p-type anode layer or $n^+$ type cathode layer, it is also called an i-type layer (intrinsic region). As impurities introduced into each silicon layer configuring the diode, mainly boron (B) or the like is used in the p-type anode layer, mainly phosphorus (P) or the like is used in the $n^-$ type drift layer, and phosphorus, arsenic (As), antimony (Sb), or the like, is used in the $n^+$ type cathode layer.

Furthermore, a method is known in which a recombination center is formed by a transition metal such as gold (Au), platinum (Pt), or iron (Fe) being introduced into the n– type drift layer, thereby controlling the lifetime of the minority carriers. This method accelerates the reverse recovery characteristics of the diode. Another method is known in which lifetime is controlled by irradiating with a light element such as proton (H+) or helium (He), thereby generating defects in the silicon layer. These methods are useful as methods of carrying out localized lifetime control.

Also, the following method has been proposed as a method of forming a diode p-n junction without implementing a heretofore known diffusion method using boron. An n-type semiconductor layer with a low impurity concentration is epitaxially grown on an n-type semiconductor substrate, an oxide film of a desired pattern is formed on the surface of the n-type semiconductor layer, and an active region edge portion and guard ring region are formed by ion implantation, with the oxide film as a mask. Further, the portion in which the active region is formed is exposed, a paste containing platinum is applied to the back surface of the semiconductor substrate in this condition, and the platinum is thermally diffused. In this way the vicinity of the surface of the semiconductor layer active region is inverted to p-type, whereby an inversion region is shallowly formed (for example, refer to JP-A-2002-231968).

A description will be given of a heretofore known diode structure. FIG. 19 is a sectional view showing a heretofore known diode structure. As shown in FIG. 19, p-type inversion region 103 is shallowly formed below a region of a surface of $n^-$ type drift layer 102 not covered with oxide film 105. P-type inversion region 103 is formed by $n^-$ type drift layer 102 inverting to p-type due to high concentration platinum accumulated in a region in the vicinity of the surface of $n^-$ type drift layer 102.

A p-type anode region is configured of p-type inversion region 103. In FIG. 19, the interface of the region in which the conductivity type is inverted by the diffusion of platinum is shown by a broken line (the same also applies in other drawings). The interface shown by the broken line is p-n junction portion 108 of p-type inversion region 103 and $n^-$ type drift layer 102. Reference signs 101, 104, 106, and 107 in FIG. 19 are an $n^+$ type semiconductor substrate that forms an $n^+$ type cathode layer, a p-type guard ring region, an anode electrode, and a cathode electrode.

A description will be given, referring to FIGS. 20 to 22, of a method of manufacturing the diode shown in FIG. 19. FIGS. 20 to 22 are sectional views showing conditions partway through the manufacture of the heretofore known diode. Firstly, oxide film 105 is formed by thermal oxidation on the surface of $n^-$ type drift layer 102 deposited on $n^+$ type semiconductor substrate 101. Next, a portion of oxide film 105 corresponding to the region in which p-type guard ring region 104 is to be formed is removed. Next, with the remaining portion of oxide film 105 as a mask, boron is ion implanted into $n^-$ type drift layer 102. The condition thus far is shown in FIG. 20.

Next, heat treatment is carried out at a temperature of 1,000° C. or more, thereby forming p-type guard ring region 104. At this time, the silicon surface is covered with oxide film 105. Next, a portion of oxide film 105 corresponding to the region in which an active region is to be formed is removed. In this condition, silica paste 110 containing platinum is applied to the back surface of $n^+$ type semiconductor substrate 101, and the platinum is thermally diffused by heat treatment at about of 900° C. The condition thus far is shown in FIG. 21. Because of this, the vicinity of the surface of $n^-$ type drift layer 102 active region is inverted to p-type, whereby p-type inversion region 103 is formed. The condition thus far is shown in FIG. 22. Subsequently, anode electrode 106 and cathode electrode 107 are formed, thereby completing the diode and reaching the condition shown in FIG. 19.

It is known that the platinum diffused in $n^+$ type semiconductor substrate 101 and $n^-$ type drift layer 102 has a U-shaped impurity concentration distribution eccentrically located at a high concentration at the silicon surface (for example, refer to JP-A-2009-239269). The high concentration platinum eccentrically located at $n^-$ type drift layer 102 surface acts as an acceptor, compensating the impurity concentration in the vicinity of the surface of $n^-$ type drift layer 102. Because of this, the vicinity of the surface of $n^-$ type drift layer 102 active region is inverted to p-type, whereby p-type inversion region 103 is formed. The diode shown in FIG. 19 is such that p-type inversion region 103 is utilized as a p-type anode region.

The heretofore described diode manufacturing method is such that, by the n-type impurity concentration in the vicinity of the surface of $n^-$ type drift layer 102 being compensated by the platinum that has been formed into an acceptor, p-n junction portion 108 of p-type inversion region 103 and $n^-$ type drift layer 102 is formed. Because of this, variation occurs in the platinum concentration distribution in the silicon layer after platinum diffusion due to variation in the platinum diffusion conditions, and there is a tendency for the junction depth of p-n junction portion 108 and the carrier concentration distribution of p-type inversion region 103 to be unstable.

Also, p-type inversion region 103 formed by the platinum being formed into an acceptor has a shallow diffusion depth compared with that of a p-type diffusion region formed by a p-type impurity such as boron being diffused, and the p-type impurity concentration also tends to be low. Because of this, the electrical field intensity of the p-type anode region formed of p-type inversion region 103 in the vicinity of an aperture end portion of p-n junction portion 108 increases when there is reverse bias, and there is concern that the breakdown voltage will decrease noticeably.

A method including a step of introducing point defects into one main surface of a semiconductor substrate, and a step of the electrical activation of a transition metal being advanced by the point defects by the transition metal being introduced from the one main surface or other main surface of the semiconductor substrate after the point defect introduction step, has been proposed as a method of eliminating this kind of problem (for example, refer to JP-A-2012-38810).

Furthermore, a method whereby the curvature radius of the end portion of the p-type inversion region is increased and the electrical field concentration in the end portion of the p-type inversion region alleviated by the end portion form after patterning of a dielectric forming a mask for selectively introducing the transition metal being tapered by damaging the surface of the dielectric, thereby controlling the intake of platinum into the oxide film, is proposed in JP-A-2012-38810. Also, JP-A-2012-38810 discloses that the process can be shortened by the p-type regions of the active region and termination structure region both being formed in the platinum diffusion step.

A description will be given of another example of a method of manufacturing the heretofore known diode. FIGS. 23 to 27 are sectional views showing another example of conditions partway through the manufacture of the heretofore known diode. FIGS. 23 to 27 are FIG. 10 of JP-A-2012-38810. Firstly, oxide film 116 is formed on $n^-$ type drift layer 112 deposited on the front surface of $n^+$ type semiconductor substrate 111. Next, oxide film 116 surface is damaged using plasma treatment. The condition thus far is shown in FIG. 23.

Next, oxide film 116 is selectively removed by etching. Because of this, the end portion form of oxide film 116 after patterning is a tapered form that widens from the upper surface side toward $n^-$ type drift layer 112 side. Next, with the remaining portion of oxide film 116 as a mask, a boron ion implantation is carried out from $n^-$ type drift layer 112 surface, thus selectively introducing point defects into the vicinity of the surface of $n^-$ type drift layer 112. The condition thus far is shown in FIG. 24. Next, silica paste 120 containing platinum is applied to the back surface of $n^+$ type semiconductor substrate 111, and the platinum is thermally diffused at a temperature of in the region of 900° C. The condition thus far is shown in FIG. 25.

The formation of the platinum into an acceptor is advanced by the point defects introduced into $n^-$ type drift layer 112, and p-type inversion region 113 is stably formed only in an exposed region of $n^-$ type drift layer 112 not covered with oxide film 116. The condition thus far is shown in FIG. 26. Subsequently, anode electrode 117 and cathode electrode 118 are formed, thereby completing the diode and reaching the condition shown in FIG. 27. Reference signs 114 and 115 in FIG. 26 are a p-type guard ring region and a p-type channel stopper region.

As a method of controlling the platinum concentration distribution, JP-A-2009-239269 discloses a method whereby the platinum concentration distribution is controlled by the vacancy density in the silicon substrate being controlled by heat treatment at a temperature of 1,150° C. or more, and the platinum being diffused into vacancies introduced into the silicon substrate.

Also, another method has been proposed in which a heavy metal is diffused in a semiconductor substrate and then a low-lifetime predetermined region is provided in the semiconductor substrate by the interior of the semiconductor substrate being irradiated with charged particles, and heat treatment at 650° C. or more is performed (for example, refer to JP-A-2003-282575). In JP-A-2003-282575, crystal defects are locally formed by helium irradiation at an arbitrary depth in the silicon layer, and the platinum concentration is locally increased by the platinum being moved by heat treatment into a region in which the helium is eccentrically located.

A method also has been proposed that includes a heavy metal diffusion step of diffusing a heavy metal into a semiconductor substrate from one surface of the semiconductor substrate, a masking step of protecting a desired region of the surface of the semiconductor substrate after the diffusion, an electron beam irradiation step of irradiating with an electron beam from the surface side after protecting the region, and a heat treatment step of carrying out heat treatment at 650° C. or more after the electron beam irradiation (for example, refer to Japanese Patent No. 3,952, 452). In Japanese Patent No. 3,952,452, the platinum concentration distribution is controlled by the electron beam irradiation and heat treatment being carried out after the platinum diffusion. By disposing a mask that controls the electron dose on the silicon surface at this time, the platinum concentration distribution is formed in the element plane.

A method also has been proposed that includes a step of attaching or diffusing an impurity element onto or into a semiconductor substrate, and a step of irradiating the semiconductor substrate with charged particles of a light element, forming a getter layer in a region in the semiconductor substrate in which the charged particles stop, and causing the impurity element to concentrate in the getter layer by subjecting the semiconductor substrate to heat treatment, thereby forming a low-lifetime layer (for example, refer to JP-A-4-125933). In JP-A-4-125933, the platinum in the semiconductor substrate is disposed again by the proton irradiation and heat treatment being carried out after the platinum diffusion, thereby controlling the platinum concentration distribution.

The following method also has been proposed. Firstly, prior to diffusing a heavy metal in a semiconductor wafer, an inert element Ar is implanted into the semiconductor wafer. The Ar implantation is carried out from the semiconductor wafer surface above the position in the semiconductor wafer in which a p-n junction is formed. Subsequently, a heavy metal diffusion is carried out (for example, refer to JP-A-2008-4704). In JP-A-2008-4704, the platinum is evenly diffused by Ar being implanted into the silicon surface before the platinum diffusion.

Another method has been proposed in which a level due to platinum is formed in a proton irradiation position by carrying out proton irradiation and heat treatment after a diffusion of platinum from platinum silicide (for example, refer to D. Hu et al, "Effect of Proton Irradiation Dose on the Gettering Efficiency of Platinum and the Performance of Local Lifetime-Controlled Power Diodes" (*Japan Journal of Applied Physics,* 2007, Volume 46, Issue 2, Pages 566 to 568)). It also has been proposed that recovery characteristics are changed by carrying out a helium or proton irradiation on a diode into which platinum or palladium (Pd) has been introduced as a lifetime killer (for example, refer to J. Vobecky et al "The Radiation Enhanced Diffusion (RED) Diode Realization of a Large Area $p^+p^-n^-n^+$ Structure with High SOA" (IEEE 21st International Symposium on Power Semiconductor Devices & IC's 2009: ISPSD 2009 (Barcelona), June, 2009, Pages 144 to 147) and J. Vobecky et al "Fast Recovery Radiation Enhanced Diffusion (RED)

Diode: Palladium versus Platinum" (13th European Conference on Power Electronics and Applications 2009: EPE 2009 (Barcelona), October 2009, Pages 1 to 8)).

However, as a result of committed research by the inventors, the following new points have become clear.

Device Characteristic Depreciation

In JP-A-2002-231968 and JP-A-2012-38810, it is possible to form a p-n junction portion of a p-type inversion region and an $n^-$ type drift layer in the vicinity of a surface of the $n^-$ type drift layer by platinum diffusion, and in JP-A-2012-38810 it is possible to improve the stability of forming the p-type inversion region by platinum diffusion by the introduction of point defects, but it is not possible to greatly change the platinum diffusion itself in the $n^-$ type drift layer. Because of this, the junction depth of the p-n junction portion of the p-type inversion region and $n^-$ type drift layer is shallow at about 1 μm to 3 μm from the $n^-$ type drift layer surface.

The junction depth of the p-n junction portion of the p-type inversion region and $n^-$ type drift layer is relatively determined by the donor concentration of the $n^-$ type drift layer and the acceptor concentration in the vicinity of the surface of the $n^-$ type drift layer compensated by the platinum acceptor. Because of this, it is possible to increase the junction depth of the p-n junction portion of the p-type inversion region and $n^-$ type drift layer by increasing the compensation by the platinum acceptor or reducing the donor concentration of the $n^-$ type drift layer.

For example, by raising the platinum diffusion temperature, it is possible to increase the compensation by the platinum acceptor in the vicinity of the surface of the $n^-$ type drift layer. However, the donor concentration other than in the vicinity of the surface of the $n^-$ type drift layer is also compensated by the platinum acceptor, and a problem occurs in that the lifetime of the whole of the $n^-$ type drift layer decreases, and the on-state voltage (forward voltage VF) increases. Also, when reducing the donor concentration of the $n^-$ type drift layer, a problem occurs in that reverse surge withstand capability decreases, and the like. Also, it is unrealistic in terms of diode manufacture to reduce the donor concentration by as large an extent to which the compensation by the platinum acceptor changes.

As above, it is difficult to increase the junction depth of the p-n junction portion of the p-type inversion region and $n^-$ type drift layer. However, when the element characteristics are adversely affected by damage (wire bonding damage) received from the chip surface when assembling or by impurities or moisture diffused from the chip surface, there is a demand for the device characteristics to be stabilized by the p-n junction portion of the p-type inversion region and $n^-$ type drift layer being a deep junction.

Device Breakdown Voltage Variation

Also, in JP-A-2012-38810, the curvature of the end portion of the p-type inversion region is increased, and stabilization of breakdown voltage is achieved, by controlling the intake of platinum into the oxide film. However, the junction depth of the p-n junction portion of the p-type inversion region and $n^-$ type drift layer being small, and the p-type inversion region formation in the oxide film aperture portion depending on the controllability of the intake of platinum into the oxide film, are essentially causes of variation in the end portion form of the p-type inversion region.

The curvature radius of the end portion of the p-type inversion region resulting from compensation by the platinum acceptor is extremely small in comparison with the curvature radius of the end portion of the p-type inversion region formed by a thermal diffusion of a p-type impurity such as boron. As a result of this, there is a problem in that the electrical field intensity of the end portion of a p-type anode region formed of the p-type inversion region increases easily when there is reverse bias, the device breakdown voltage decreases, and the leakage current is unstable.

Deterioration of Trade-Off Between Forward Voltage VF and Reverse Recovery Current IRP Also, the diode indicated in JP-A-2002-231968 and JP-A-2012-38810 is such that there is concern that the trade-off between forward voltage VF and reverse recovery current IRP will deteriorate more than with a p-n junction diode formed of a p-type diffusion region fabricated to have the same breakdown voltage. It is assumed that this is due to the lifetime killer distribution of the platinum.

The lifetime killer distribution of the platinum is not sufficiently explained. This is because, for example, as the platinum detection sensitivity obtained from secondary ion mass spectroscopy (SIMS) is also high, in the vicinity of $1 \times 10^{15}$ atoms/cm$^3$, only the outermost platinum concentration distribution of the $n^-$ type drift layer is observed, and it is not possible to directly detect the platinum concentration distribution in the vicinity of the p-n junction portion, which affects device operation.

Therefore, the inventors have measured the resistivity distribution of the $n^-$ type drift layer after platinum diffusion, and estimated the lifetime killer distribution of the platinum by analogizing the platinum concentration distribution from the resistivity distribution. This is a method whereby the acceptor concentration distribution is estimated from the resistance change occurring when the impurity concentration of the $n^-$ type drift layer is compensated by platinum that has been formed into an acceptor, and the impurity concentration distribution of the platinum functioning as a lifetime killer is estimated from the acceptor concentration distribution. Results verifying this method of measuring platinum concentration distribution are shown in FIG. 17.

FIG. 17 is a characteristic diagram showing hole lifetime distribution in an n-type silicon layer. FIG. 17 is an $n^-$ type drift layer minority carrier (hole) lifetime distribution when assuming that the acceptor concentration distribution estimated from the resistivity change in the $n^-$ type drift layer occurring due to an eccentric location of platinum is equivalent to the platinum concentration distribution. Specifically, FIG. 17 shows the minority carrier (hole) lifetime distribution of a fast diode when the p-n junction portion is formed by platinum diffusion under general diffusion conditions (two hours at a temperature of 910° C.). As shown in FIG. 17, it is found that the resistivity change due to the eccentric location of platinum increases from a depth of in the region of 50 μm to 60 μm in the surface direction of the $n^-$ type drift layer.

When forming the p-n junction portion by platinum diffusion, the position of a p-n junction portion junction depth Xj and the position of an impurity concentration distribution change point A of the platinum functioning as a lifetime killer are far apart. Generally, a lifetime killer acts most efficiently in the vicinity of the p-n junction portion junction depth Xj, but being acted on in a portion deeper than the p-n junction portion junction depth Xj, and the lifetime being considerably reduced, is not desirable, as it leads to an increase in the forward voltage VF.

Consequently, as the lifetime distribution in the $n^-$ type drift layer differs with, for example, p-n junction portion junction depths Xj of 2 μm and 10 μm, the on-state voltage increases more when the p-n junction portion junction depth Xj is the shallower 2 µm. Meanwhile, it is assumed that the reverse recovery current IRP is smaller when the p-n junction portion junction depth Xj is the shallower 2 µm. However, the optimal p-n junction portion junction depth Xj (at which the VF-IRP trade-off is optimal) for the lifetime distribution is not clarified.

Normally, when forming the p-n junction portion by thermal diffusion of boron or the like, the p-n junction portion junction depth Xj can be variously changed in accordance with the boron dose and thermal diffusion conditions. However, when forming the p-n junction portion by platinum diffusion, controllability of the p-n junction portion junction depth Xj deteriorates, as it is limited by the concentration distribution of platinum eccentrically located at the surface of the n⁻ type drift layer. A comparison will be made of the relationship between forward voltage and reverse recovery current between a diode formed of a p-type inversion region formed by a platinum acceptor and a normal p-n diode formed of a p-type diffusion region.

FIG. 18 is a characteristic diagram showing the relationship between forward voltage and reverse recovery current of heretofore known diodes. As shown in FIG. 18, it is clear that the trade-off characteristics of the forward voltage VF and reverse recovery current IRP of a diode formed of a p-type inversion region formed by a platinum acceptor are inferior in comparison with those of a normal p-n diode formed of a p-type diffusion region.

FIG. 18 shows diodes with a 400V breakdown voltage, wherein a forward current IF is taken to be 10 A and a current change rate di/dt is taken to be 100 A/µsec, but the kind of relationship between the forward voltage VF and reverse recovery current IRP shown in FIG. 18 appears more noticeably in a thick device with a breakdown voltage of 600V or more wherein the thickness of the n⁻ type drift layer is more than the range of 50 µm to 60 µm, as heretofore described.

Also, in JP-A-2009-239269, JP-A-2003-282575, Japanese Patent No. 3,952,452, and JP-A-4-125933, there is a description of a method of controlling the platinum concentration distribution using vacancies or crystal defects of helium or the like, but there is no description of a p-n junction diode being formed by the action of advancing the formation of platinum into an acceptor, as there is in JP-A-2002-231968 and JP-A-2012-38810. That is, in JP-A-2009-239269, JP-A-2003-282575, Japanese Patent No. 3,952,452, and JP-A-4-125933, there is no description or hint as to whether or not the platinum acts as an acceptor, no mention of the impurity concentration distribution of platinum that has been formed into an acceptor, or of a method of controlling platinum acceptor concentration. Consequently, it is not possible in JP-A-2009-239269, JP-A-2003-282575, Japanese Patent No. 3,952,452, or JP-A-4-125933 to solve the problems that occur in JP-A-2002-231968 and JP-A-2012-38810.

The present invention is directed to overcoming or at least reducing the effects of one or more of the problems set forth above.

SUMMARY OF THE INVENTION

The invention, in order to eliminate the problems of the heretofore known technology, has an object of providing a semiconductor device and semiconductor device manufacturing method such that, by platinum being caused to act as an acceptor, it is possible to stably manufacture a semiconductor device with high electrical characteristics. Also, the invention, in order to eliminate the problems of the heretofore known technology, has an object of providing a semiconductor device and semiconductor device manufacturing method such that it is possible to manufacture a semiconductor device with high electrical characteristics, wherein platinum is caused to act as an acceptor, using a simplified manufacturing process.

Also, in order to solve the heretofore described problems and achieve the objects of the invention, a semiconductor device manufacturing method according to an aspect of the invention has the following characteristics. Firstly, a point defect introduction step of introducing point defects into the vicinity of a surface of a first conductivity type semiconductor layer at a point defect density higher than the point defect density in the semiconductor layer in a state of thermal equilibrium is carried out. Next, a transition metal introduction step of introducing a transition metal into the region in the vicinity of the surface of the semiconductor layer into which the point defects have been introduced is carried out. Next, an activation step of using heat treatment to advance the electrical activation of the transition metal in the region into which the point defects have been introduced is carried out.

Also, in order to solve the heretofore described problems and achieve the objects of the invention, a semiconductor device manufacturing method according to an aspect of the invention has the following characteristics. Firstly, a transition metal introduction step of introducing a transition metal into the vicinity of a surface of a first conductivity type semiconductor layer is carried out. Next, an activation step of using heat treatment to electrically activate the transition metal is carried out. Next, a point defect introduction step of introducing point defects into the region into which the transition metal has been introduced at a point defect density higher than the point defect density in the semiconductor layer in a state of thermal equilibrium is carried out. Next, a reactivation step of using heat treatment to once more electrically activate the transition metal in the region into which the point defects have been introduced after the point defect introduction step is carried out.

Also, the semiconductor device manufacturing method according to the above aspects of the invention is such that one light element irradiation is carried out, or two or more light element irradiations with differing irradiation conditions are carried out successively, in the point defect introduction step, thereby introducing the point defects.

Also, the semiconductor device manufacturing method according to the above aspects of the invention is such that a mask formation step of forming on the surface of the semiconductor layer a dielectric mask having a thickness that can control the amount of the light element reaching the semiconductor layer in accordance with the light element irradiation conditions is further carried out before the point defect introduction step.

Also, the semiconductor device manufacturing method according to the above aspects of the invention is such that the dielectric mask is formed in the mask formation step so that an end portion form of the dielectric mask is a tapered form that widens from an upper surface side toward the semiconductor layer side.

Also, the semiconductor device manufacturing method according to the above aspects of the invention is such that the light element is proton or helium.

In order to solve the heretofore described problems and achieve the objects of the invention, a semiconductor device according to an aspect of the invention has the following characteristics. A first point defect region into which point defects are introduced at a point defect density higher than the point defect density in a first conductivity type semiconductor layer in a state of thermal equilibrium is provided in the vicinity of a surface of the first conductivity type semiconductor layer. A second conductivity type first inversion region formed by the first point defect region being doped with an electrically activated transition metal is provided. A p-n junction portion formed of the semiconductor layer and first inversion region is formed.

Also, the semiconductor device according to the above aspect of the invention further includes a first electrode in contact with the first inversion region and a second electrode in contact with the semiconductor layer.

Also, the semiconductor device according to the above aspect of the invention is such that a first electrode in contact with the surface of the semiconductor layer on the side on which the first inversion region is provided is provided. A first conductivity type high concentration semiconductor layer with an impurity concentration higher than that of the semiconductor layer is provided on the surface of the semiconductor layer on the side opposite to the side on which the first electrode is provided. A second electrode in contact with the high concentration semiconductor layer is provided.

Also, the semiconductor device according to the above aspect of the invention is such that a second point defect region into which point defects are introduced at a point defect density higher than the point defect density in the semiconductor layer in a state of thermal equilibrium is provided in the vicinity of the surface of the semiconductor layer in a termination structure region provided so as to enclose the first inversion region. A second conductivity type second inversion region formed by the second point defect region being doped with an electrically activated transition metal is provided.

Also, the semiconductor device according to the above aspect of the invention is such that the transition metal is platinum.

According to the invention, by the end portion form of the mask dielectric (oxide film) of the light element irradiation for introducing the point defects being a tapered form that widens from the upper surface side to the n⁻ type drift layer side, it is possible to change the amount of platinum taken into the mask dielectric in accordance with the thickness of the tapered portion of the mask dielectric. Because of this, it is possible to control the curvature radius of the end portion of the p-type inversion enhancement region. Also, it is possible to change the penetration depth of the light element irradiation from the n⁻ type drift layer surface side using the tapered portion of the mask dielectric. Because of this, it is possible to form the point defect region with a desired point defect density distribution, and with good controllability.

Also, according to the invention, by platinum being introduced into the region in which the point defect region has been introduced, the formation of the platinum into an acceptor is advanced by the point defect region, and it is possible to form the p-type inversion enhancement region formed by the platinum being formed into an acceptor in accordance with the point defect density distribution of the point defect region. Because of this, by controlling the point defect density distribution of the point defect region, it is possible to control the depth of the p-type inversion enhancement region. Because of this, when utilizing the p-type inversion enhancement region as an anode region, it is possible to form a p-n junction portion of the anode region and a drift layer to a predetermined junction depth, stably and with good controllability.

Also, according to the invention, as it is possible to control the depth of the p-type inversion enhancement region and the curvature radius of the end portion, it is possible to set the junction depth of the p-n junction portion of the p-type inversion enhancement region and n⁻ type drift layer so that the trade-off between the forward voltage (on-state voltage) and reverse recovery current is optimal for each device structure. Consequently, it is possible to stably manufacture a diode with excellent reverse bias characteristics including a p-type anode region formed by the formation of platinum into an acceptor.

Also, according to the invention, by using the thick oxide film formed over the whole surface of the n⁻ type drift layer as a mask dielectric of the light element irradiation for introducing the point defects, it is possible to form the p-type anode region of the active region and the p-type guard ring region and p-type channel stopper region of the termination structure region simultaneously. Because of this, it is possible to simplify the semiconductor device manufacturing process.

According to the semiconductor device and semiconductor device manufacturing method according to the invention, an advantage is achieved in that, by platinum being caused to act as an acceptor, it is possible to stably manufacture a semiconductor device with high electrical characteristics. Also, according to the semiconductor device and semiconductor device manufacturing method according to the invention, an advantage is achieved in that it is possible to manufacture a semiconductor device with high electrical characteristics, wherein platinum is caused to act as an acceptor, using a simplified manufacturing process

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereafter, referring to the attached drawings, a detailed description will be given of preferred embodiments of a semiconductor device and semiconductor device manufacturing method according to the invention. A layer or region prefixed by n or p in the specification and attached drawings means that electrons or holes respectively are majority carriers. Also, + or − added to n or p means that there is a higher impurity concentration or lower impurity concentration respectively than in a layer or region to which + or − is not added. In the following embodiment description and attached drawings, the same reference signs are given to the same configurations, and a redundant description is omitted.

Basic Structure

Figure 1:
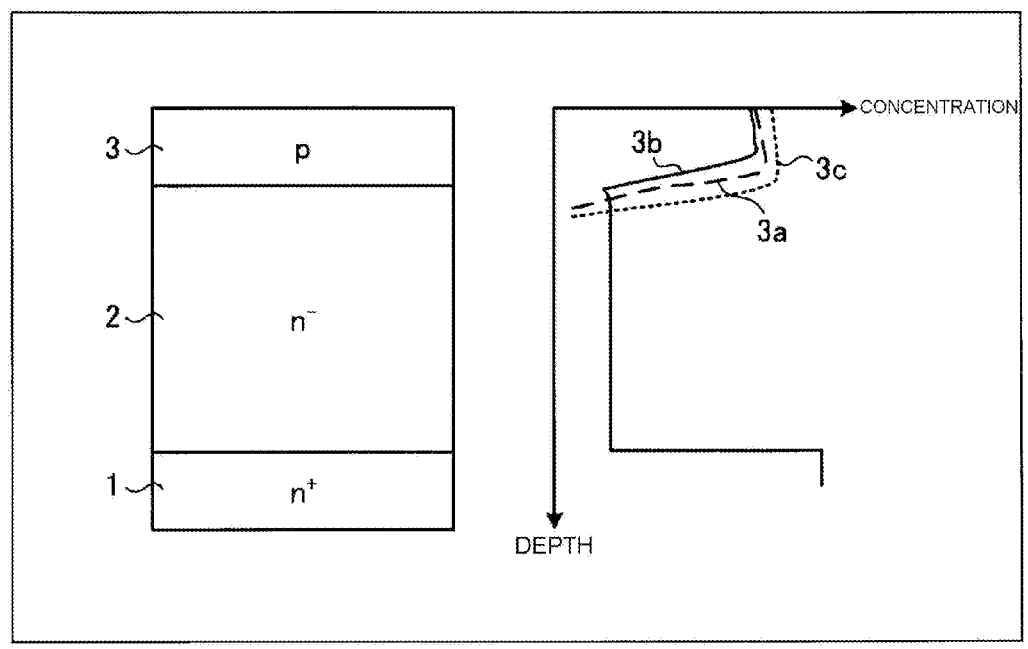
FIG. 1 is a sectional view showing the basic structure of a semiconductor device according to the invention.

A description will be given, with a diode as an example, of the basic structure of the semiconductor device according to the invention. FIG. 1 is a sectional view showing the basic structure of the semiconductor device according to the invention. FIG. 1 shows the basic sectional structure of the semiconductor device according to the invention, and the impurity concentration distribution in the substrate depth direction. As shown in FIG. 1, the semiconductor device according to the invention includes an n$^+$ type cathode layer (first conductivity type high concentration semiconductor layer) formed of n$^+$ type semiconductor substrate 1, n$^-$ type drift layer (first conductivity type semiconductor layer) 2, p-type anode region 3, a cathode electrode (second electrode) omitted from the drawing, and an anode electrode (first electrode) omitted from the drawing.

N$^+$ type semiconductor substrate 1 is, for example, a semiconductor chip formed by a CZ wafer fabricated using a general Czochralski (CZ) process being cut. Antimony (Sb) or arsenic (As) is introduced at a dose of higher than $1 \times 10^{18}/cm^3$ into n$^+$ type semiconductor substrate 1 as an n-type impurity. N$^-$ type drift layer 2, formed by doping with an n-type impurity such as phosphorus using, for example, an epitaxial growth process, is deposited on the front of n$^+$ type semiconductor substrate 1, by doing which a semiconductor substrate formed of n$^+$ type semiconductor substrate 1 and n$^-$ type drift layer 2 is configured. N$^-$ type drift layer 2 has a function of maintaining a high element breakdown voltage.

p-type anode region 3 is formed in a surface layer of one main surface (the surface on the side opposite to that of n$^+$ type semiconductor substrate 1) of n$^-$ type drift layer 2. P-type anode region 3 is configured of p-type inversion enhancement region (first inversion region) 3b formed by n$^-$ type drift layer 2 being inverted to a p-type by a high concentration transition metal such as platinum (Pt) accumulated in a region in the vicinity of the surface of n$^-$ type drift layer 2. The point defect density distribution of point defect region 3a is higher than the point defect density distribution in n$^-$ type drift layer 2 in a state of thermal equilibrium, and is distributed approximately evenly in p-type inversion enhancement region 3b. When p-type inversion enhancement region 3b is formed, point defect region 3a acts as a getter layer of the platinum forming an acceptor.

P-type inversion enhancement region 3b includes point defect region 3a, which is formed by irradiation with a light element such as proton (H$^+$), and the formation of platinum into an acceptor is advanced by point defect region 3a. Specifically, p-type inversion enhancement region 3b is formed by the platinum formed into an acceptor being distributed approximately evenly in point defect region 3a. Also, it is preferable that p-type inversion enhancement region 3b has an approximately even box-like impurity concentration distribution as far as a certain depth in the depth direction from the one main surface of n$^-$ type drift layer 2. Also, the impurity concentration distribution of platinum diffusion region 3c formed when diffusing the platinum in order to form p-type inversion enhancement region 3b is a distribution near the point defect distribution of point defect region 3a. The anode electrode (not shown) is provided on the surface of p-type inversion enhancement region 3b so as to be in contact with p-type inversion enhancement region 3b. The cathode electrode (not shown) is provided on the back surface of n$^+$ type semiconductor substrate 1 so as to be in contact with n$^+$ type semiconductor substrate 1.

Basic Structure Characteristics

The basic structure of the semiconductor device according to the invention has two characteristics. The first characteristic is that p-type anode region 3 has p-type inversion enhancement region 3b formed by the introduction of platinum formed into an acceptor by being electrically activated. That is, platinum atoms positioned in the silicon lattice positions in n⁻ type drift layer 2, and electrically activated, are introduced. The second characteristic is that the point defect region 3a is formed in p-type anode region 3 to a point defect density equal to or higher than the point defect density in n⁻ type drift layer 2 in a state of thermal equilibrium. Point defect region 3a is introduced approximately evenly at a high concentration through the whole of the region in which p-type anode region 3 is formed. The formation into an acceptor of the platinum configuring p-type inversion enhancement region 3b is advanced by point defect region 3a.

It is easy for the platinum atoms diffused in the semiconductor substrate to move into excess point defects, mainly vacancies, formed in one main surface of the semiconductor substrate, and it is easy for the platinum atoms that have moved to enter silicon crystal lattice positions. The platinum atoms that have entered lattice defects become donors or acceptors. That is, by point defect region 3a being introduced into the region forming p-type anode region 3 at a concentration higher than the impurity concentration of p-type inversion enhancement region 3b in a state of thermal equilibrium, it is possible to advance the formation into an acceptor of the platinum diffused in n⁻ type drift layer 2.

The phenomenon whereby platinum eccentrically located in the vicinity of the surface of the n-type silicon layer acts as an acceptor and is inverted into a p-type layer in this way, and the formation into an acceptor of the platinum is advanced by the introduction of the point defect region, will hereafter be referred to as an inversion enhancement effect. That is, by controlling the point defect density distribution of point defect region 3a introduced into the vicinity of one main surface of n⁻ type drift layer 2, it is possible to control the impurity concentration distribution of p-type anode region 3 formed of p-type inversion enhancement region 3b, which is formed by the formation into an acceptor of the platinum, so as to be an impurity concentration sufficiently higher than that of n⁻ type drift layer 2.

The second characteristic is that the point defect density distribution of point defect region 3a formed by irradiation with a light element is an approximately even, high concentration distribution through the whole of p-type anode region 3. Because of this, it is possible for the junction depth of a p-n junction portion of n⁻ type drift layer 2 and p-type inversion enhancement region 3b to be greater than that heretofore known, and it is possible for a region wherein the platinum diffused in n⁻ type drift layer 2 functions as a lifetime killer to be formed to a depth similar to that of p-type inversion enhancement region 3b.

The diffusion mechanism of a transition metal, taking the transition metal to be M and vacancies to be V, is expressed by Expressions 1 and 2 below.

$$M(i)+V \Leftrightarrow M(s) \qquad 1$$

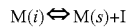

$$M(i) \Leftrightarrow M(s)+I \qquad 2$$

Expression 1 above is called the Frank-Turnbull mechanism. Expression 2 above is called the kick-out mechanism. Expressions 1 and 2 are diffusion mechanisms representing the interaction of transition metal atoms and point defects. Herein, M(i) represents interstitial transition metal atoms, M(s) represents lattice position transition metal atoms, and I represents Si self interstitial atoms. It is assumed that the lattice position transition metal atoms M(s) act as, for example, acceptors. Meanwhile, as the interstitial transition metal atoms M(i) have a large diffusion coefficient in comparison with boron (B) or phosphorus, which are normally dopants, they quickly reach a state of equilibrium in the silicon layer.

As the interstitial transition metal atoms M(i) quickly reach a state of equilibrium in the silicon layer, the concentration of the lattice position transition metal atoms M(s) is determined by the point defect density distribution of the vacancies V and the concentration (distribution) of the Si self interstitial atoms I. Because of this, by intentionally introducing the vacancies V, it is possible to control the concentration distribution of the lattice position transition metal atoms M(s). Further, the more vacancies V that are introduced, the higher the concentration of the transition metal atoms in the silicon crystal lattice positions becomes. Consequently, in order for the platinum to become an acceptor, it is important that the platinum atoms enter the silicon crystal lattice positions, as with the mechanisms shown in Expressions 1 and 2.

In order for the platinum atoms to enter the silicon crystal lattice positions, it is necessary that the silicon crystal lattice positions are available. Consequently, it is preferable that, of the point defects, vacancies or divacancies are introduced into the silicon crystal lattice positions. Meanwhile, vacancies or divacancies inevitably exist in the silicon wafer in the process of introducing the interstitial silicon, interstitial impurity, and substitutional impurity, and in the process of these diffusing. Because of this, in order to activate the lattice position transition metal atoms M(s) using the mechanisms shown in Expressions 1 and 2, firstly, it is necessary to introduce more point defects, preferably vacancies or divacancies, into the silicon layer than those in a state of thermal equilibrium, and allow the point defects to exist.

Next, a description will be given of the average point defect density of n⁻ type drift layer 2 in a state of thermal equilibrium. When forming a single crystal ingot by crystal pulling, or when forming an device structure by normal dopant (phosphorus, boron, or the like) diffusion or thermal oxide film formation on a silicon wafer formed by a single crystal ingot being sliced, the single crystal ingot or silicon wafer is subjected to heat treatment at a temperature of 1,000° C. or more.

One portion of the point defects introduced when the heat treatment is carried out remains in the silicon layer at a point defect density of, in the case of, for example, vacancies, in the region of $1 \times 10^3 / \text{cm}^3$ to $1 \times 10^7 / \text{cm}^3$ when cooling. Because of this, when forming the p-type anode region 3, it is sufficient that vacancies of a point defect density higher than the point defect density of the vacancies remaining in the silicon layer when cooling are introduced into the silicon layer as point defect region 3a. For example, as the impurity concentration of p-type inversion enhancement region 3b (p-type anode region 3) is in the region of $1 \times 10^{15} / \text{cm}^3$ to $1 \times 10^{17} / \text{cm}^3$, it is preferable that the point defect density of the point defect region 3a is also in the region of $1 \times 10^{15} / \text{cm}^3$ to $1 \times 10^{17} / \text{cm}^3$, around the same as the impurity concentration of p-type inversion enhancement region 3b.

By point defect region 3a (formed mainly of vacancies) being formed at the heretofore described kind of point defect density, platinum is substituted into the point defect lattice positions in point defect region 3a, becoming an acceptor. In order to stably form the p-n junction portion of p-type inversion enhancement region 3b and n⁻ type drift layer 2 to a given junction depth, it is necessary to form point defect region 3a at a predetermined point defect density so as to have good controllability in the depth direction. A method of doing so will be described hereafter. Ideally, when it is possible to form the point defect region 3a with a box-like lattice defect distribution in the depth direction, it is possible to stably form a p-n junction portion of a given depth.

Embodiment 1

Figure 2:
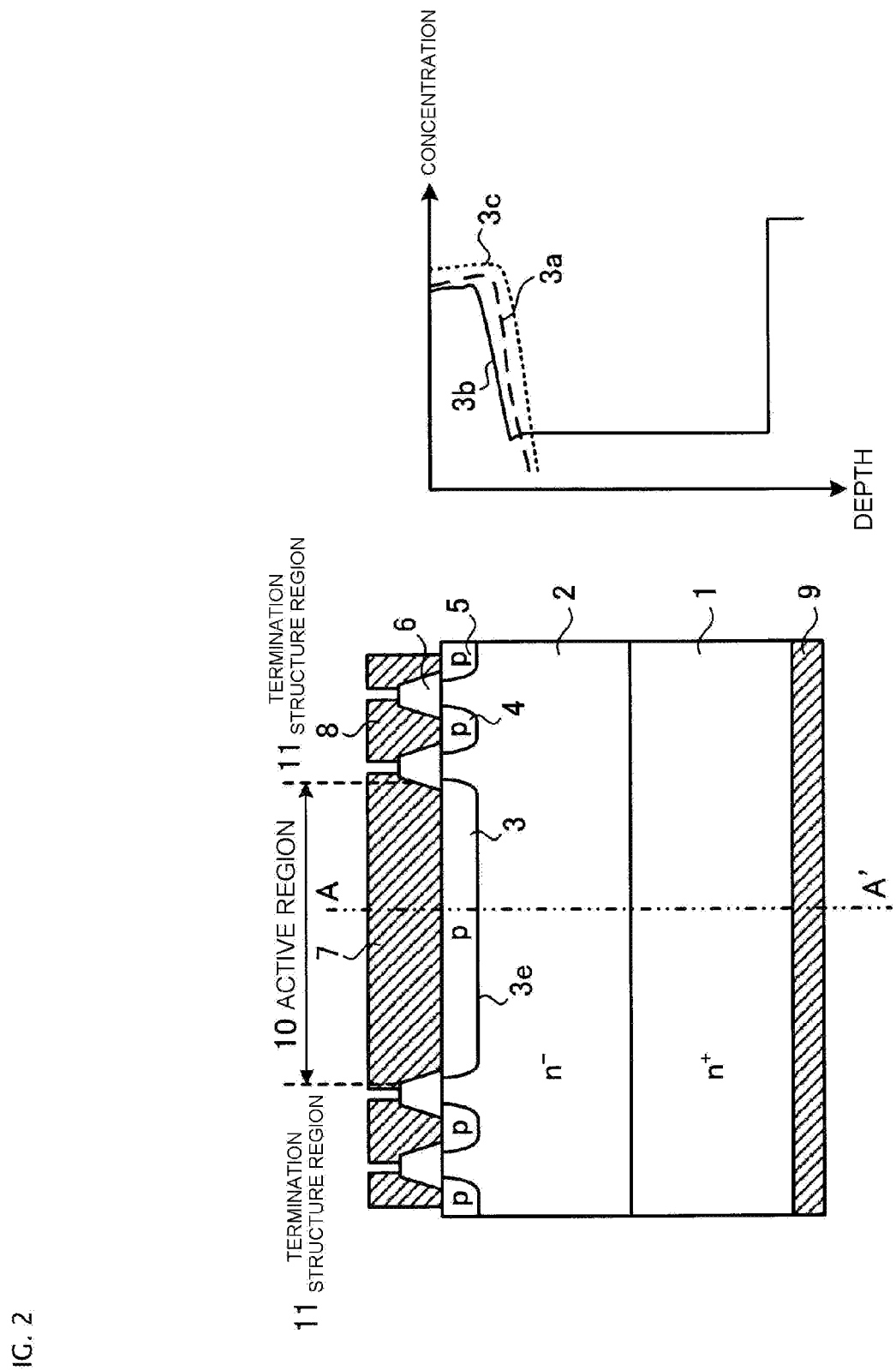
FIG. 2 is a sectional view showing the configuration of a semiconductor device according to Embodiment 1.

Next, a description will be given of the structure of a semiconductor device according to Embodiment 1. FIG. 2 is a sectional view showing the configuration of the semiconductor device according to Embodiment 1. FIG. 2 shows the sectional structure of the semiconductor device according to Embodiment 1, and the impurity concentration distribution in the depth direction. The semiconductor device according to Embodiment 1 shown in FIG. 2 is a diode wherein p-type guard ring region (second inversion region) 4 and p-type channel stopper region 5 of a termination structure region 11 are provided in the basic structure of the diode shown in FIG. 1.

Termination structure region 11, being a region from an end portion of active region 10 to an outer peripheral end portion of the semiconductor substrate (semiconductor chip), is a structural portion that encloses active region 10, and alleviates the electrical field intensity of the semiconductor substrate front surface (the surface on n⁻ type drift layer 2 side) generated when voltage is applied to the device. Active region 10, being a region in which anode electrode 7 of the semiconductor substrate is formed, is a region through which current flows when the device is in an on-state.

Specifically, as shown in FIG. 2, the semiconductor device according to Embodiment 1 includes the arsenic-doped low resistance n⁺ type semiconductor substrate 1 forming an n⁺ type cathode layer, n⁻ type drift layer 2, which is a phosphorus-doped epitaxially grown layer, p-type anode region 3, p-type guard ring region 4, p-type channel stopper region 5, oxide film (dielectric mask) 6, anode electrode 7, field plate 8, and cathode electrode 9. The thickness and impurity concentration of n⁺ type semiconductor substrate 1 are, for example, 500 μm and $2\times10^{19}/cm^3$, respectively.

The thickness and impurity concentration of n⁻ type drift layer 2 are, for example, 100 μm and $7\times10^{13}/cm^3$, respectively. One portion of a surface (the surface on the side opposite to that of n⁺ type semiconductor substrate 1, hereafter referred to simply as the surface) of n⁻ type drift layer 2 is covered with oxide film 6. The end portion form of the inner peripheral side and outer peripheral side of oxide film 6 is a tapered form (hereafter referred to as a tapered portion) widening from the surface (upper surface) side on the side opposite to that of n⁻ type drift layer 2 to n⁻ type drift layer 2 side.

P-type anode region 3 is formed shallowly below a region of the surface of n⁻ type drift layer 2 not covered with oxide film 6, and below a region covered with the tapered portion of oxide film 6. The configurations of n⁺ type semiconductor substrate 1, n⁻ type drift layer 2, and p-type anode region 3 are the same as in the basic structure of the invention shown in FIG. 1. That is, p-type anode region 3 is configured of p-type inversion enhancement region 3b including point defect region 3a, which is a characteristic of the invention.

The junction depth of p-type inversion enhancement region 3b, that is, the depth of the p-n junction, is in the region of, for example, 10 μm or less. The junction depth of p-type inversion enhancement region 3b changes in accordance with the depth of point defect region 3a formed by n⁻ type drift layer 2 being irradiated with a light element, the platinum thermal diffusion conditions, and the subsequent heat treatment conditions, and in particular, is limited by the point defect density distribution of point defect region 3a.

That is, by controlling the point defect density distribution of point defect region 3a, it is possible to regulate the depth of p-n junction portion 3e of p-type inversion enhancement region 3b and n⁻ type drift layer 2. Also, it is possible to control the impurity concentration distribution of an outer peripheral side end portion of the p-n junction portion 3e of the p-type inversion enhancement region 3b and n⁻ type drift layer 2 in accordance with the lateral direction distribution of the point defect density of point defect region 3a in the vicinity of the tapered portion of oxide film 6. Point defect region 3a may be formed by, for example, a double irradiation with a light element such as proton.

P-type guard ring region 4 is formed in, for example, a single ring form, although this is not particularly limited, in a region on the surface side of n⁻ type drift layer 2 so as to enclose p-type anode region 3. Two or more of p-type guard ring region 4 may be provided in accordance with the rated voltage. When the rated voltage is a low voltage in the region of, for example, 100V, it is acceptable that no p-type guard ring region 4 is provided. P-type channel stopper region 5 is formed in a single ring form on the outermost side of a region on the surface side of n⁻ type drift layer 2 so as to enclose p-type anode region 3 and p-type guard ring region 4.

Each of p-type guard ring region 4 and p-type channel stopper region 5, in the same way as p-type anode region 3, is configured of p-type inversion enhancement region 3b including point defect region 3a wherein the formation of the platinum into an acceptor is advanced by irradiation with a light element. P-type guard ring region 4 and p-type channel stopper region 5 may also be configured of a p-type diffusion region formed by a p-type impurity being diffused. An n-type channel stopper region configured of an n-type diffusion region formed by an n-type impurity being diffused may be provided instead of p-type channel stopper region 5.

Anode electrode 7 is formed so as to be in contact with p-type anode region 3. Field plate 8 is formed so as to be in contact with p-type guard ring region 4 and p-type channel stopper region 5. Cathode electrode 9 is formed so as to be in contact with the back surface of n⁺ type semiconductor substrate 1.

Embodiment 2

Next, a description will be given of a method of manufacturing the semiconductor device according to Embodiment 1 as a semiconductor device manufacturing method according to Embodiment 2. FIGS. 3 to 6 are sectional views showing conditions partway through the manufacture of the semiconductor device according to Embodiment 2. For example, the description will be given taking the rated voltage to be 1,000V and the transition metal used in the formation of p-type inversion enhancement region 3b to be platinum (the same also applies in other Embodiments 3 and 5). Firstly, n⁻ type drift layer 2 with a thickness of, for example, 100 μm is epitaxially grown with a resistivity of 60 Ωcm on n⁺ type semiconductor substrate 1 forming an n⁺ type cathode layer.

Next, oxide film 6 with a thickness of, for example, 900 nm is formed using thermal oxidation on the surface of n⁻ type drift layer 2. The thickness of oxide film 6 is arbitrarily determined in accordance with the dose and penetration depth of proton penetrating through oxide film 6 and into n⁻ type drift layer 2 when oxide film 6 is used as a mask for proton (H⁺) irradiation, to be described hereafter, and with the degree of formation of the platinum into an acceptor accompanying damage caused by the light element irradiation. Next, heat treatment is carried out for several hours at a temperature of in the region of 1,000° C. in, for example, phosphorus oxychloride (POCl) gas, thereby forming, for example, phosphorus silicon glass (PSG, not shown) on oxide film 6 surface. Because of this, the thickness of oxide film 6 becomes, for example, 950 nm including the thickness of the phosphorus silicon glass.

Figure 3:
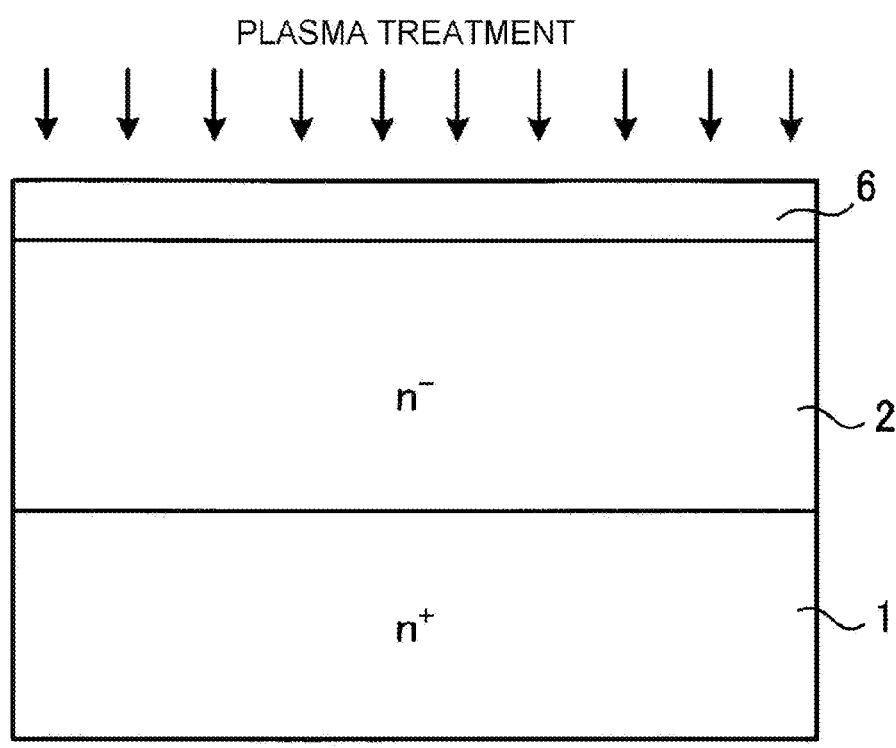
FIG. 3 is a sectional view showing a condition partway through the manufacture of a semiconductor device according to Embodiment 2.

Next, a 20 second plasma treatment is carried out on the surface of oxide film 6 in plasma with an output power of 300 W in a mixed gas of, for example, tetrafluoromethane ($CF_4$) gas and carbon tetrachloride ($CCl_4$) gas, thereby damaging oxide film 6. The condition thus far is shown in FIG. 3. Next, a portion of oxide film 6 corresponding to the region in which active region 10 is to be formed is removed using a photolithography technique and etching, at the same time as which, portions of oxide film 6 corresponding to the regions in which p-type guard ring region 4 and p-type channel stopper region 5 are to be formed are removed in, for example, a ring form.

Damaged oxide film 6 is such that, as the etching rate of the wet etching varies, it is possible for the end portion form of oxide film 6 to be a tapered form that widens from the upper surface side toward $n^-$ type drift layer 2 side. A lateral direction (a direction parallel to the main surface of $n^+$ type semiconductor substrate 1) length LOT of the tapered portion of oxide film 6 is, for example, 4.7 μm. The lateral direction length LOT of the tapered portion of oxide film 6 is a length in the region of 4.9 times the thickness of oxide film 6.

Next, with the remaining portion of oxide film 6 as a mask, an irradiation with proton ($H^+$) is carried out on $n^-$ type drift layer 2. The proton irradiation is carried out, for example, twice using, for example, a tandem Van de Graaff accelerator. The first proton irradiation is of, for example, a dose of $1 \times 10^{14}/cm^2$, and an accelerating voltage of 0.5 MeV. The second proton irradiation is of, for example, a dose of $1 \times 10^{14}/cm^2$, and an accelerating voltage of 0.75 MeV. Also, the proton irradiation may be carried out three times or more. In this case, the conditions for each proton irradiation may all be the same, or may all differ.

Figure 4:
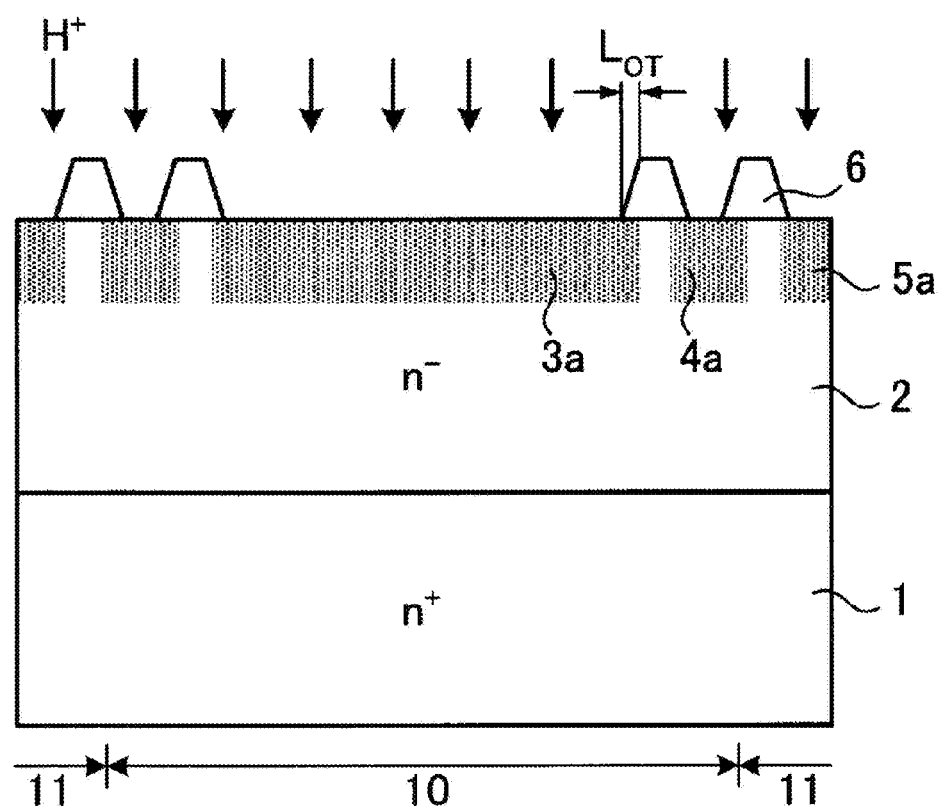
FIG. 4 is a sectional view showing a condition partway through the manufacture of the semiconductor device according to Embodiment 2.

Owing to the proton irradiation, point defect region 3a is formed in the region in which active region 10 is formed, and point defect regions 4a and 5a are formed in termination structure region 11, in the regions in which p-type guard ring region 4 and p-type channel stopper region 5 respectively are formed. Also, by the end portion of oxide film 6 being of a tapered form that widens from the upper surface side toward $n^-$ type drift layer 2 side, the amount of the proton irradiation in the end portions of point defect regions 3a, 4a, and 5a is controlled in accordance with the thickness of the tapered portion of oxide film 6. The condition thus far is shown in FIG. 4. Point defect regions 3a, 4a, and 5a formed by the proton irradiation are shown by hatching in FIG. 4. The end portions (portions below oxide film 6) of point defect regions 3a, 4a, and 5a have curvature, but this is omitted from the drawing (the same also applies to other drawings).

Figure 5:
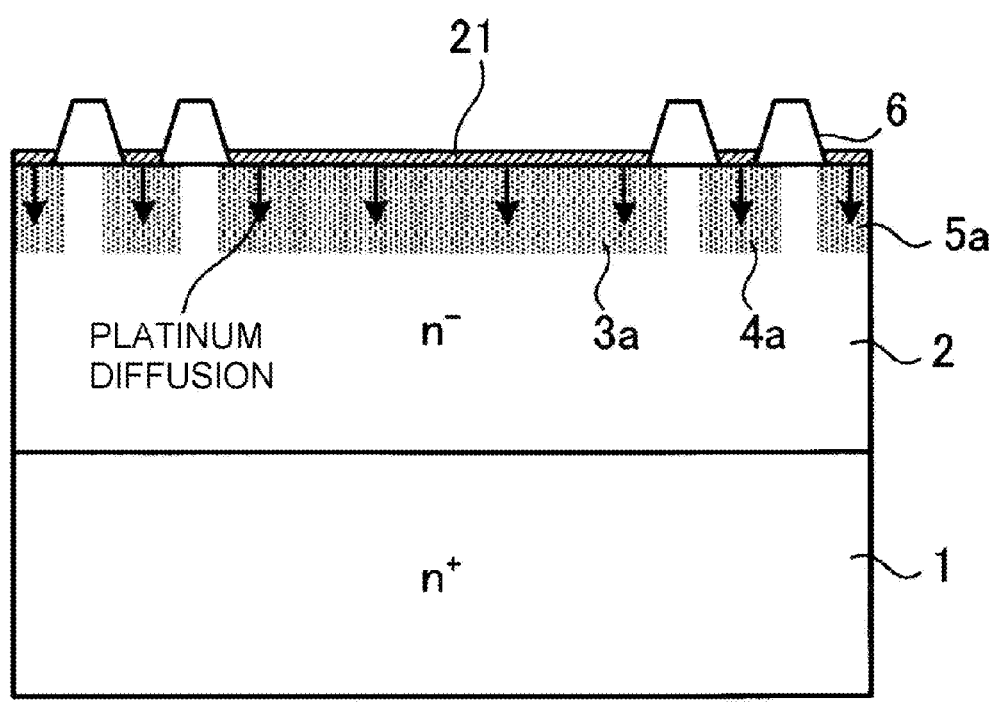
FIG. 5 is a sectional view showing a condition partway through the manufacture of the semiconductor device according to Embodiment 2.
Figure 6:
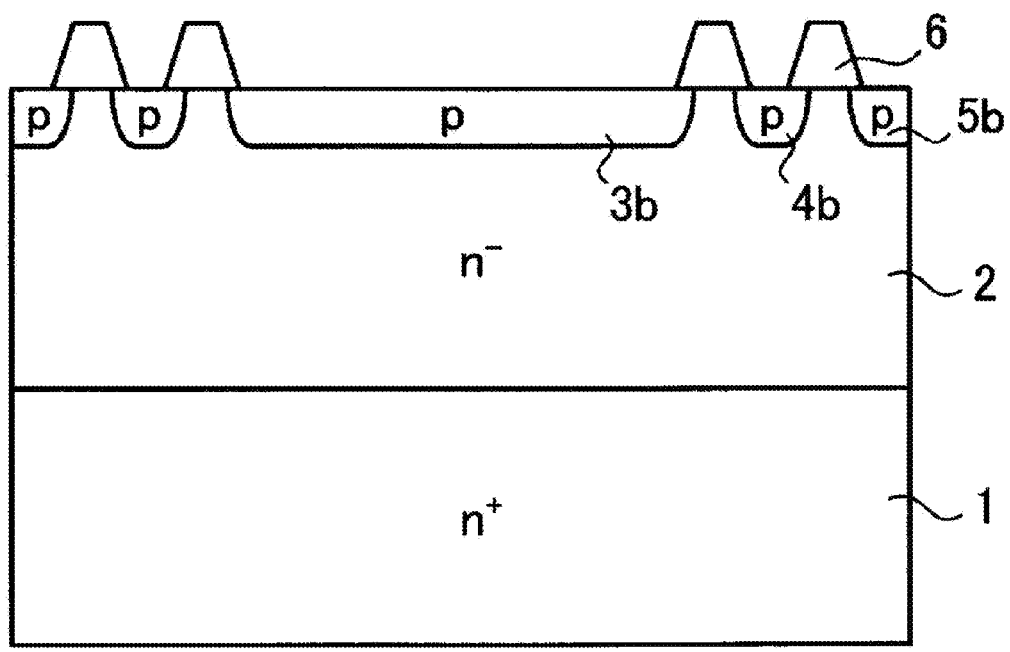
FIG. 6 is a sectional view showing a condition partway through the manufacture of the semiconductor device according to Embodiment 2.

Next, silica paste 21 containing 1% by weight of platinum is applied to an exposed region of $n^-$ type drift layer 2 surface not covered by oxide film 6, and heat treatment is carried out for three hours at, for example, 930° C. The condition thus far is shown in FIG. 5. Subsequently, silica paste 21 is removed with hydrofluoric acid. Through the processes thus far, the vicinity of the surface of active region 10 and the vicinity of the surface of termination structure region 11 of $n^-$ type drift layer 2 are inverted to p-type by platinum atoms that have been formed into acceptors, whereby p-type inversion enhancement region 3b, 4b and 5b are formed. The condition thus far is shown in FIG. 6.

P-type inversion enhancement regions 3b, 4b, and 5b, being such that the formation of the platinum into an acceptor is advanced by point defect regions 3a, 4a, and 5a, are formed in accordance with the point defect density distribution of point defect regions 3a, 4a, and 5a. The thermal diffusion of the platinum may also be carried out from the back surface of $n^+$ type semiconductor substrate 1. That is, after silica paste is applied to the back surface of $n^+$ type semiconductor substrate 1, heat treatment for platinum diffusion may be carried out. In this case, platinum is eccentrically located in the vicinity of the back surface of $n^+$ type semiconductor substrate 1 too, but as $n^+$ type semiconductor substrate 1 has a high dopant concentration, there is no inversion to a p-type layer caused by the formation of the platinum into an acceptor.

Next, for example, an aluminum-silicon (Al—Si) alloy with a thickness of 5 μm is deposited by sputtering on the wafer surface. Next, the Al—Si alloy layer is patterned into a desired form using a photolithography technique and etching. After doing so, heat treatment is carried out for one hour at 500° C. in a nitrogen ($N_2$) atmosphere, thereby forming low resistance anode electrode 7 in contact with p-type anode region 3 and low resistance field plate 8 in contact with p-type guard ring region 4 and p-type channel stopper region 5.

Anode electrode 7 and field plate 8 may also be formed by a vacuum deposition of pure aluminum. Lastly, titanium (Ti), nickel (Ni), and gold (Au) are deposited by vacuum deposition on the back surface of $n^+$ type semiconductor substrate 1 to form cathode electrode 9, thereby completing the semiconductor device and reaching the condition shown in FIG. 2. For example, the thickness of the titanium is 0.7 μm, the thickness of the nickel is 0.3 μm, and the thickness of the gold is 0.1 μm.

Embodiment 3

Figure 7:
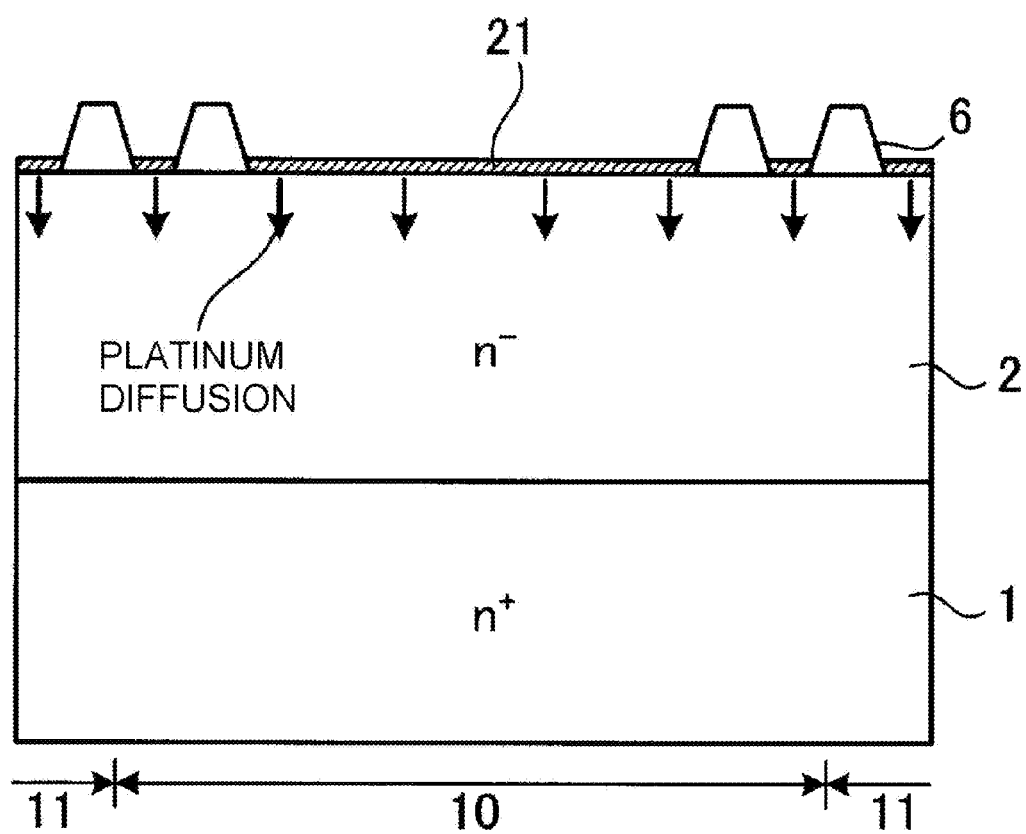
FIG. 7 is a sectional view showing a condition partway through the manufacture of a semiconductor device according to Embodiment 3.
Figure 8:
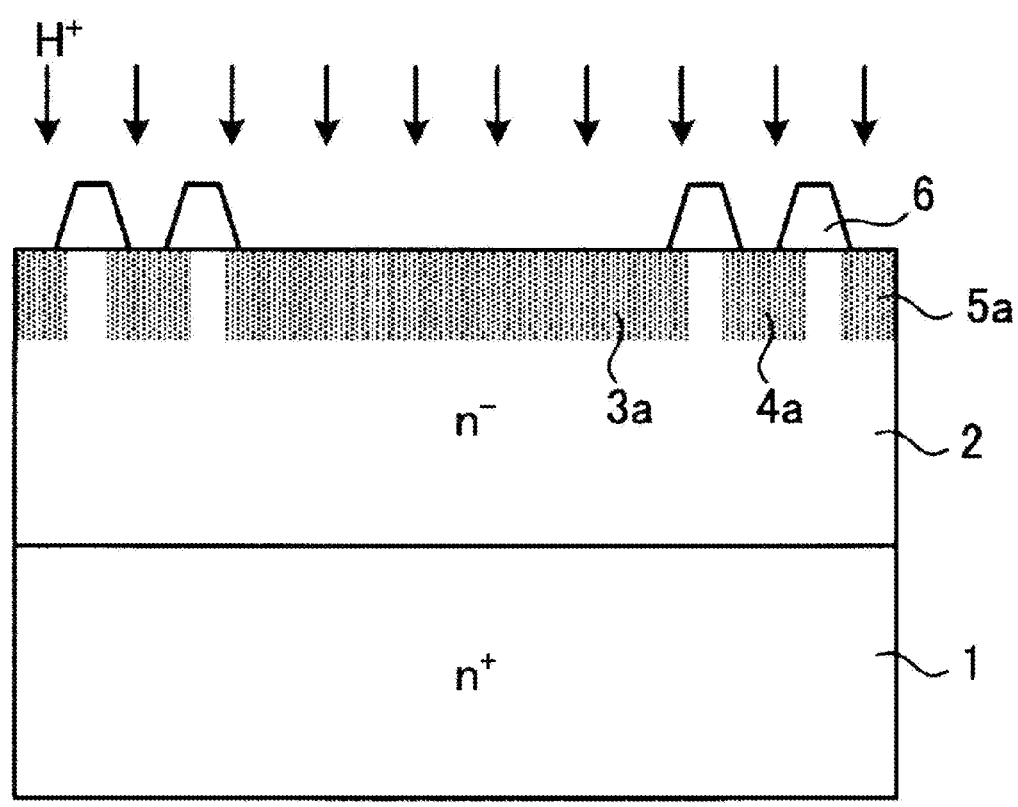
FIG. 8 is a sectional view showing a condition partway through the manufacture of the semiconductor device according to Embodiment 3.

Next, a description will be given of a semiconductor device manufacturing method according to Embodiment 3. FIGS. 7 and 8 are sectional views showing conditions partway through the manufacture of the semiconductor device according to Embodiment 3. The semiconductor device manufacturing method according to Embodiment 3 differs from the semiconductor device manufacturing method according to Embodiment 2 in that the process order of the proton irradiation and platinum diffusion is changed, so that the platinum diffusion is carried out before the proton irradiation. Specifically, the processes of the semiconductor device manufacturing method according to Embodiment 3 are carried out as follows.

Firstly, in the same way as in Embodiment 2, oxide film 6 and phosphorus silicon glass are formed sequentially on the surface of $n^-$ type drift layer 2 deposited on $n^+$ type semiconductor substrate 1, after which plasma treatment is carried out on oxide film 6 surface (FIG. 3). Next, in the same way as in Embodiment 2, a portion of oxide film 6 corresponding to the region in which active region 10 is to be formed, and portions corresponding to the regions in which p-type guard ring region 4 and p-type channel stopper region 5 are to be formed, are removed. Next, in the same way as in Embodiment 2, silica paste 21 is applied to an exposed region of $n^-$ type drift layer 2 not covered by oxide film 6, and heat treatment is carried out. The condition thus far is shown in FIG. 7.

Next, after the applied silica paste 21 is removed with hydrofluoric acid, an irradiation with proton is carried out on the n⁻ type drift layer 2, with the remaining portion of oxide film 6 as a mask. The proton irradiation method and irradiation conditions are the same as in Embodiment 2. Owing to the proton irradiation, point defect region 3a is formed in the region in which active region 10 is formed, and point defect regions 4a and 5a are formed in termination structure region 11, in the regions in which p-type guard ring region 4 and p-type channel stopper region 5 respectively are formed. The condition thus far is shown in FIG. 8.

Next, heat treatment is carried out for 30 minutes at 930° C. in a nitrogen atmosphere. As a result of the heat treatment, the vicinity of the surface of n⁻ type drift layer 2 is inverted to p-type by the platinum atoms that have been formed into acceptors. Furthermore, the platinum atoms in the n⁻ type drift layer 2 move again to point defect regions 3a, 4a, and 5a, and p-type inversion enhancement regions 3b, 4b, and 5b are formed in accordance with the point defect density distribution of the point defect regions 3a, 4a, and 5a. Because of this, in the same way as in Embodiment 2, the vicinity of the surface of active region 10 and the vicinity of the surface of termination structure region 11 of n⁻ type drift layer 2 are inverted to p-type, whereby p-type inversion enhancement regions 3b, 4b, and 5b are formed (FIG. 6). Subsequently, the semiconductor device is completed by the subsequent processes being carried out in the same way as in Embodiment 2, reaching the condition shown in FIG. 2.

Embodiment 4

Figure 9:
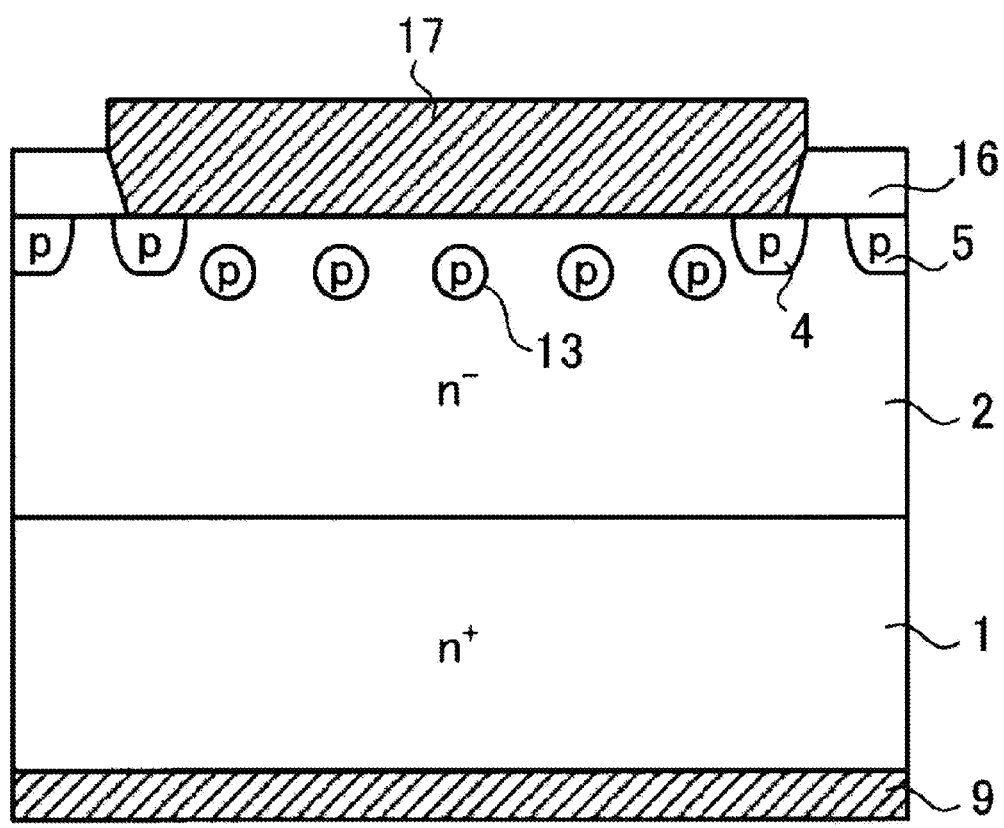
FIG. 9 is a sectional view showing the structure of a semiconductor device according to Embodiment 4.

Next, a description will be given of a semiconductor device according to Embodiment 4. FIG. 9 is a sectional view showing the structure of the semiconductor device according to Embodiment 4. The semiconductor device according to Embodiment 4 differs from the semiconductor device according to Embodiment 1 in that a plurality of p-type anode regions 13 are selectively provided in active region 10.

As shown in FIG. 9, each of the plurality of p-type anode regions 13 is provided in n⁻ type drift layer 2 in the vicinity of the surface of n⁻ type drift layer 2. Each p-type anode region 13 is configured of a p-type inversion enhancement region including a point defect region, in the same way as in Embodiment 1. The plurality of p-type anode regions 13 may be disposed in stripe form extending in a direction (for example, in FIG. 9, a direction toward the back of the drawing) parallel to n⁻ type drift layer 2 surface, or may be disposed in a matrix of dotted planar forms. Also, it is preferable that the plurality of p-type anode regions 13 are disposed at predetermined intervals.

Each of p-type guard ring region 4 and p-type channel stopper region 5 is configured of a p-type diffusion region formed by a p-type impurity such as boron being diffused. Anode electrode 17 is in contact with the whole surface of n⁻ type drift layer 2 in active region 10, and is in contact with p-type guard ring region 4. Anode electrode 17 is not in contact with p-type anode regions 13. N⁻ type drift layer 2 surface is covered with oxide film 16 in termination structure region 11, and no field plate is provided. Other configurations of the semiconductor device according to Embodiment 4 are the same as those of the semiconductor device according to Embodiment 1.

Embodiment 5

Figure 10:
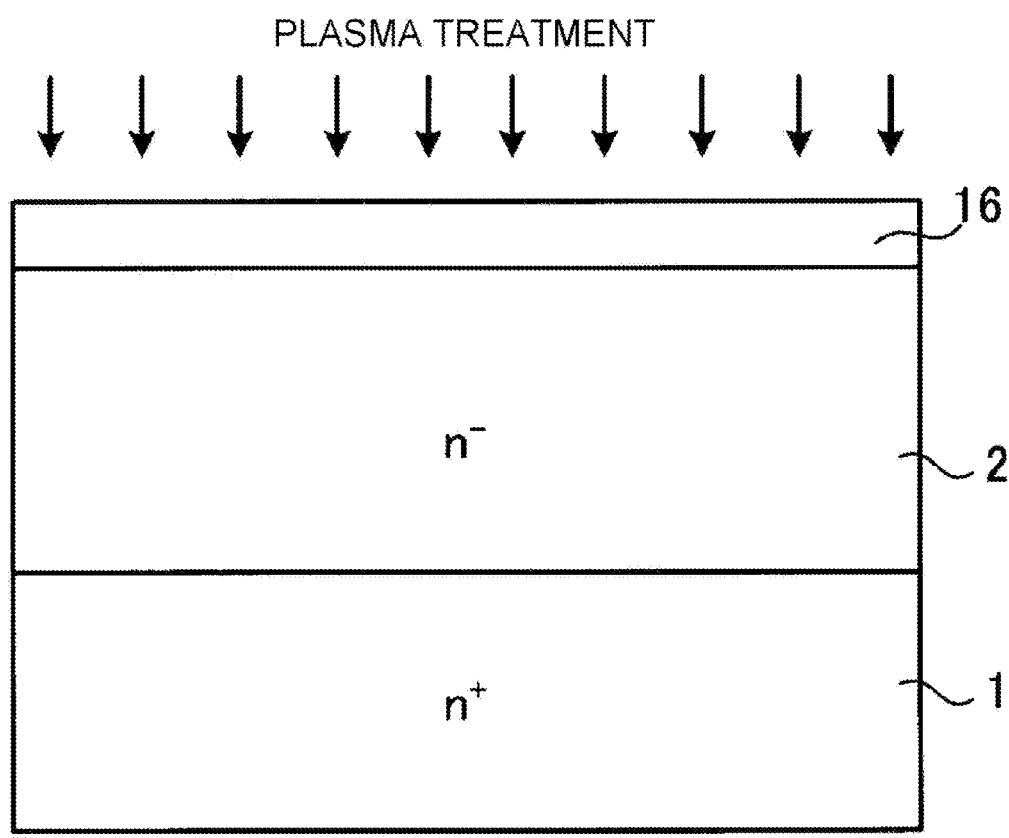
FIG. 10 is a sectional view showing a condition partway through the manufacture of a semiconductor device according to Embodiment 5.

Next, a description will be given of a method of manufacturing the semiconductor device according to Embodiment 4 as a semiconductor device manufacturing method according to Embodiment 5. FIGS. 10 to 15 are sectional views showing conditions partway through the manufacture of the semiconductor device according to Embodiment 5. Firstly, in the same way as in Embodiment 2, oxide film 16 and phosphorus silicon glass are formed sequentially on the surface of n⁻ type drift layer 2 deposited on n⁺ type semiconductor substrate 1, after which plasma treatment is carried out on the surface of oxide film 16. The condition thus far is shown in FIG. 10.

Figure 11:
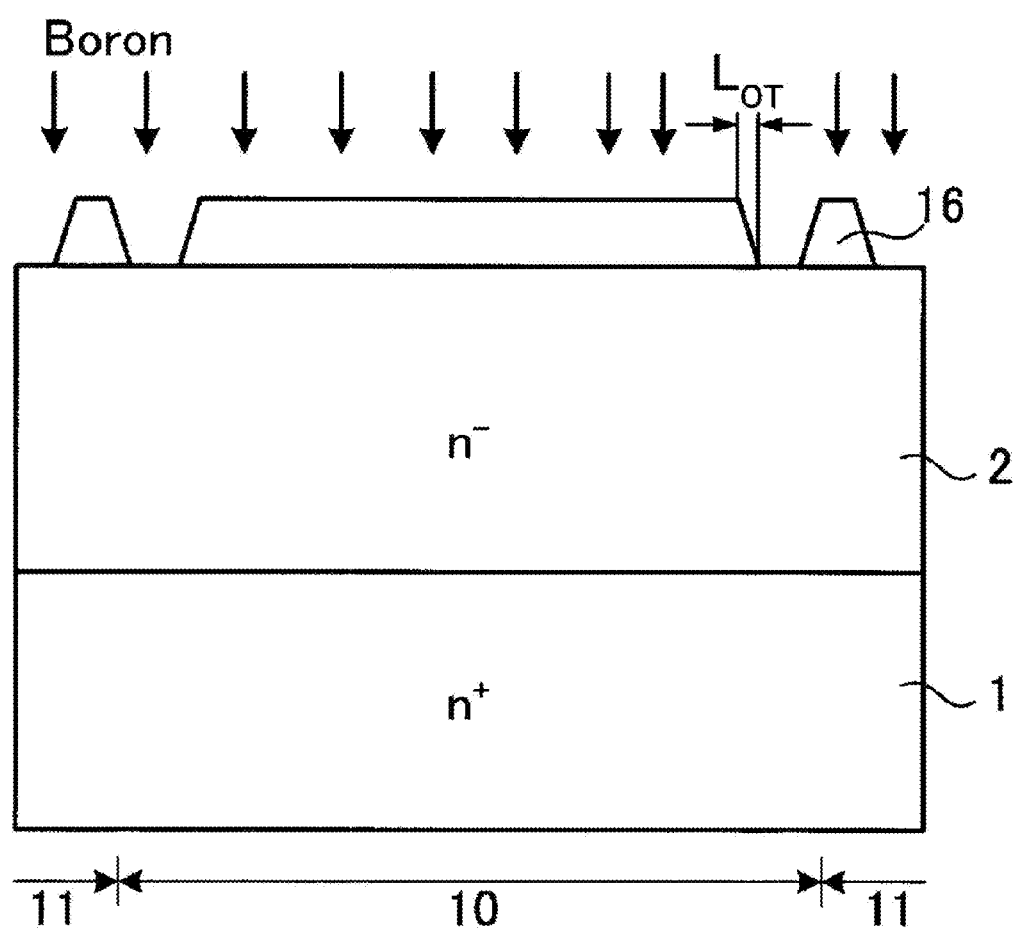
FIG. 11 is a sectional view showing a condition partway through the manufacture of the semiconductor device according to Embodiment 5.

Next, using a photolithography technique and etching, portions of oxide film 16 corresponding to the regions in which p-type guard ring region 4 and p-type channel stopper region 5 are to be formed are removed in, for example, a ring form. The end portion form of oxide film 16 becomes a tapered form owing to the etching, in the same way as in Embodiment 2. Next, with the remaining portion of oxide film 16 as a mask, boron, for example, is ion implanted into n⁻ type drift layer 2. The ion implantation is of a dose of $1 \times 10^{14}/cm^2$, and an accelerating voltage of 100 keV. The condition thus far is shown in FIG. 11.

Figure 12:
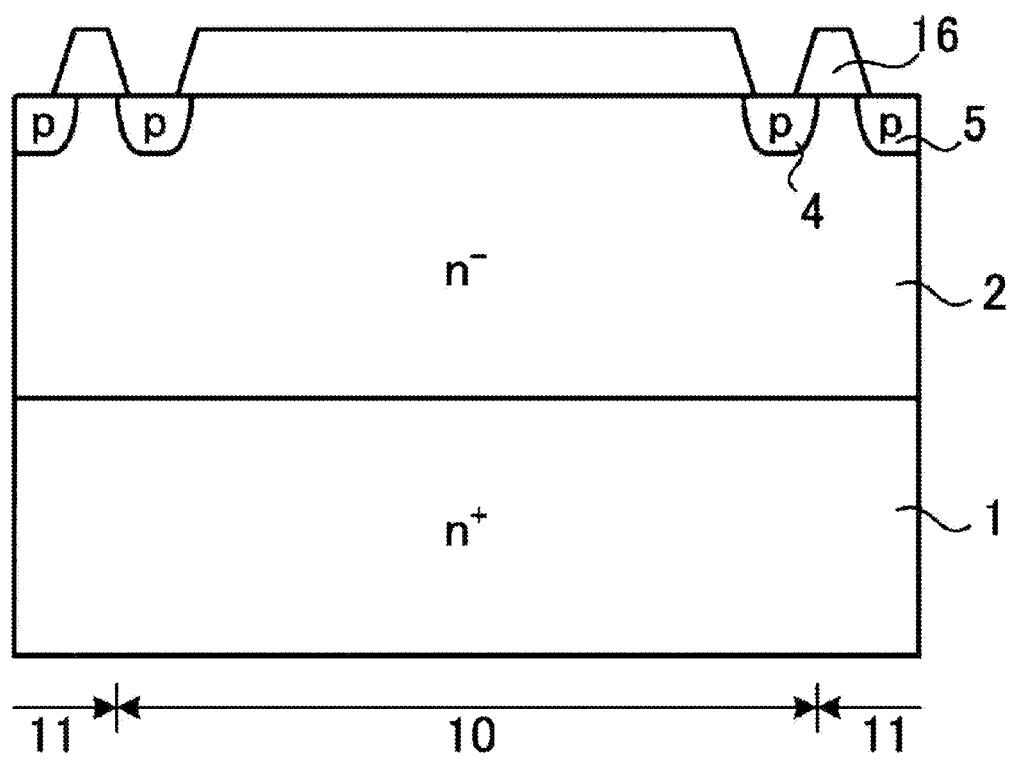
FIG. 12 is a sectional view showing a condition partway through the manufacture of the semiconductor device according to Embodiment 5.

Next, by the boron in n⁻ type drift layer 2 being thermally diffused by a three hour heat treatment at 1,150° C., p-type guard ring region 4 and p-type channel stopper region 5 are formed. The diffusion depth of p-type guard ring region 4 and p-type channel stopper region 5 is in the region of, for example, 5 µm. The condition thus far is shown in FIG. 12. Also, as the oxide film 16 is formed again at the same time by the heat treatment thermally diffusing the boron, the whole of the wafer surface is covered with oxide film 16.

Next, a portion of oxide film 16 corresponding to the region in which active region 10 is to be formed is selectively removed using a photolithography technique and etching. Next, with the remaining portion of oxide film 16 as a mask, an irradiation with proton is carried out on n⁻ type drift layer 2. The proton irradiation is carried out once using, for example, a tandem Van de Graaff accelerator, with no repetition being carried out. The proton irradiation is of a dose of $1 \times 10^{13}/cm^2$, and an accelerating voltage of 0.5 MeV.

Figure 13:
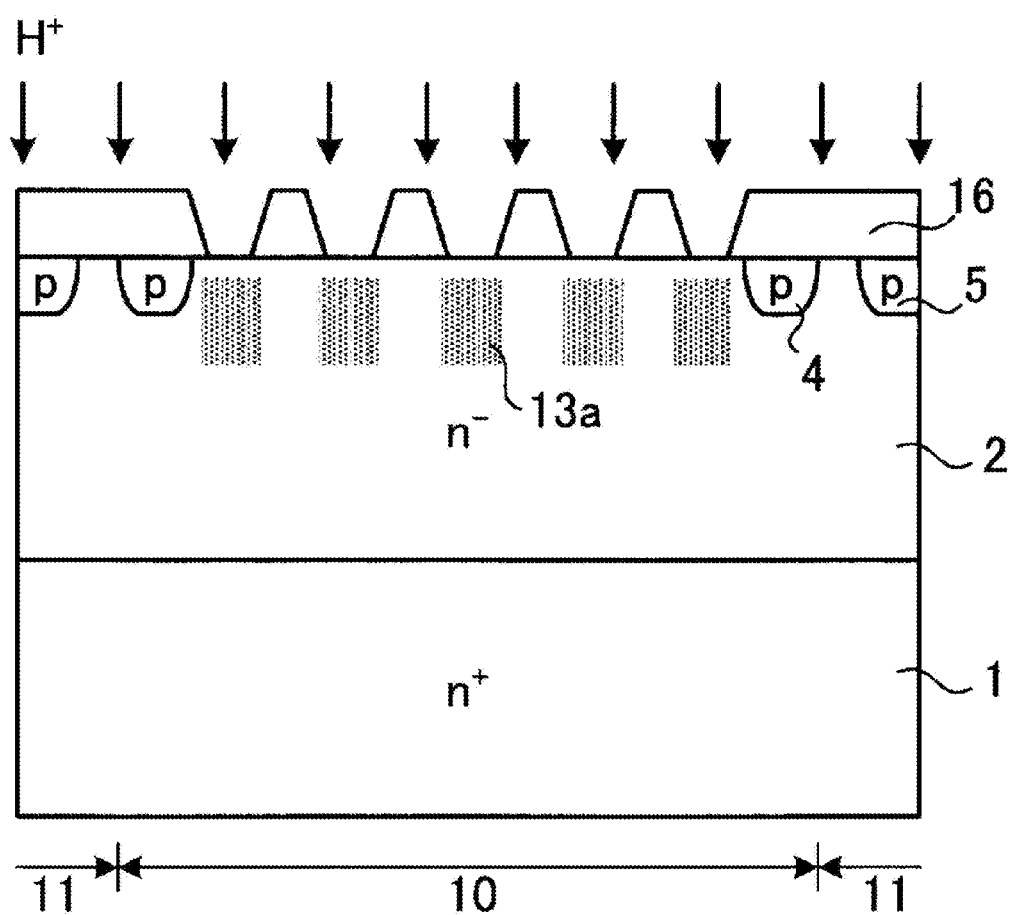
FIG. 13 is a sectional view showing a condition partway through the manufacture of the semiconductor device according to Embodiment 5.

Also, the proton irradiation is carried out under irradiation conditions such that it is presumed that the point defect density peak is at a depth of in the vicinity of approximately 5 µm from the surface of n⁻ type drift layer 2. This is so that a p-type inversion enhancement region formed in a subsequent process is formed in n⁻ type drift layer 2. Point defect regions 13a are selectively formed by the proton irradiation in the region in which the active region 10 is formed. The condition thus far is shown in FIG. 13.

Figure 14:
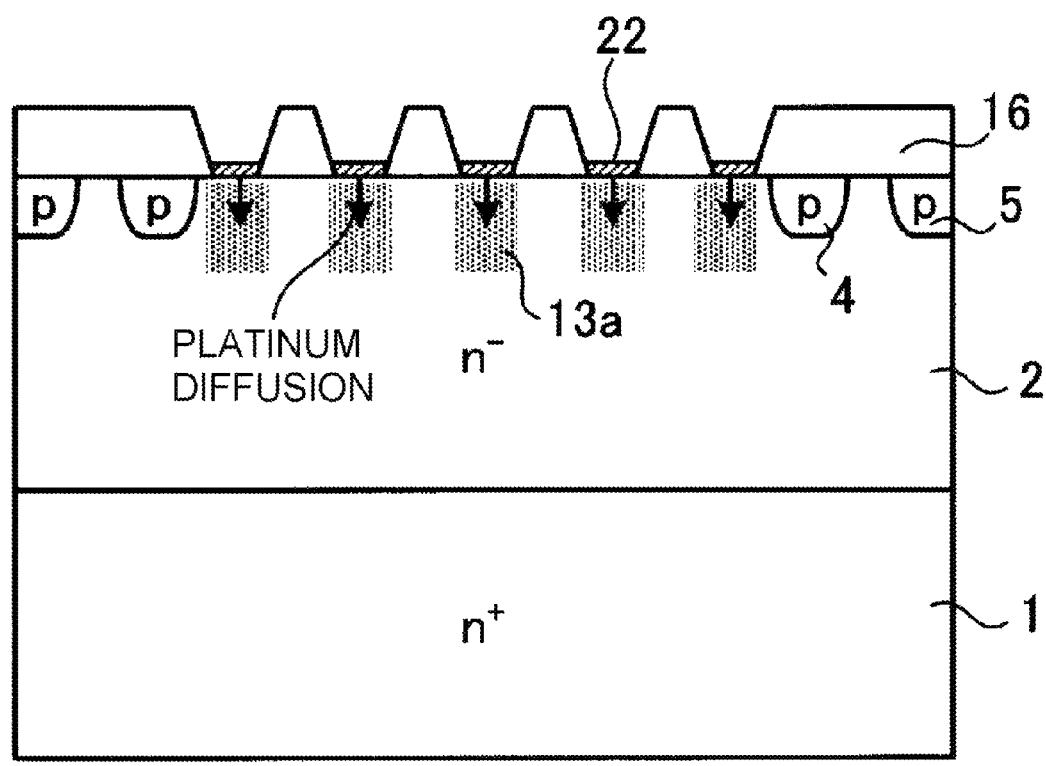
FIG. 14 is a sectional view showing a condition partway through the manufacture of the semiconductor device according to Embodiment 5.
Figure 15:
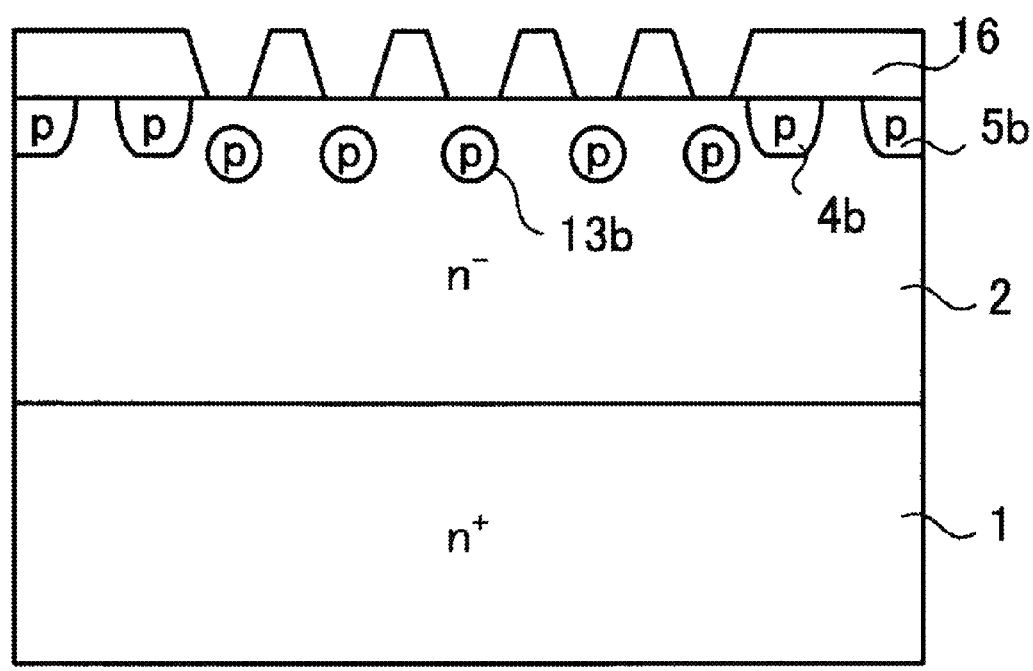
FIG. 15 is a sectional view showing a condition partway through the manufacture of the semiconductor device according to Embodiment 5.

Next, silica paste 22 containing 1% by weight of platinum is applied to an exposed region of n⁻ type drift layer 2 surface not covered by oxide film 16, and heat treatment is carried out for one hour at 930° C. The condition thus far is shown in FIG. 14. Subsequently, the applied silica paste 22 is removed with hydrofluoric acid. Through the processes thus far, a region of active region 10 of n⁻ type drift layer 2 as far as a certain depth from the surface of n⁻ type drift layer 2 is inverted to p-type by platinum that has been formed into an acceptor, whereby p-type inversion enhancement regions 13b are formed. P-type inversion enhancement regions 13b, being such that the formation of the platinum into an acceptor is advanced by point defect regions 13a, are formed in accordance with the point defect density distribution of point defect regions 13a. The condition thus far is shown in FIG. 15. The thermal diffusion of the platinum may also be carried out from the back surface of n⁺ type semiconductor substrate 1.

Next, for example, an Al—Si alloy with a thickness of 5 μm is deposited by sputtering on the wafer surface. Next, the Al—Si alloy layer is patterned into a desired form using a photolithography technique and etching. After doing so, heat treatment is carried out for one hour at 500° C. in a nitrogen atmosphere, thereby forming the low resistance anode electrode 17 in contact with the whole surface of n⁻ type drift layer 2 in the active region 10 and in contact with p-type guard ring region 4. Anode electrode 17 may also be formed by a vacuum deposition of pure aluminum. Lastly, in the same way as in Embodiment 2, titanium, nickel, and gold are deposited by vacuum deposition or sputtering on the back surface of n⁺ type semiconductor substrate 1 to form cathode electrode 9, thereby completing the semiconductor device and reaching the condition shown in FIG. 9.

The structure shown in FIG. 9 is a structure heretofore known as a static induction diode. Although normally fabricated using a p-type layer embedding epitaxial technique, a p-type impurity (boron or the like) high acceleration implantation, or the like, the structure can also be formed using the effect of enhancing the formation of platinum into an acceptor by forming a point defect region with a proton irradiation, as shown in the semiconductor device manufacturing method according to Embodiment 5.

According to each embodiment, by excess point defects, mainly vacancies, being locally and deeply introduced into the vicinity of the surface of the n⁻ type drift layer at a point defect density higher than that in the n⁻ type drift layer in a state of thermal equilibrium, the platinum atoms in the n⁻ type drift layer move, and it is easier for the platinum atoms to enter lattice positions than when there is a state of thermal equilibrium. Because of this, by controlling the point defect density and introduction depth of the point defect region, it is possible to increase the impurity concentration of the platinum that has been formed into an acceptor. Further, as the platinum concentration is distributed in the p-type inversion enhancement region to a greater extent than when there is a state of thermal equilibrium, a stable control of the platinum concentration distribution in the p-type inversion enhancement region is possible.

Furthermore, according to each embodiment, by the point defect density of the point defect region being locally, excessively distributed as far as a certain depth from the surface of the n⁻ type drift layer, the point defect density distribution of the point defect region and the distribution in the p-type inversion enhancement region become practically the same. This is equivalent to the point defect density distribution of the point defect region being near the platinum concentration distribution of the p-type inversion enhancement region. The formation of the platinum into an acceptor being advanced by the point defect region in this way, and the point defect distribution and distribution in the region formed into an acceptor being similar, are new effects not seen in heretofore known technology.

Also, platinum is preferable to other transition metals as a transition metal that is a lifetime killer. This is because the rate at which platinum is formed into an acceptor is high, the formation into an acceptor is easily advanced by point defects (vacancies), and formation of the p-type anode region is easier. Also, it is because, as the recombination center level of platinum in silicon is formed at a shallow level near the conduction band, the leakage current is low. It is clear that the heretofore described advantages obtained when using platinum as this kind of transition metal are also obtained when using, for example, gold as the transition metal.

Also, it is desirable that the point defect region is formed by irradiation with a light element such as proton (H⁺) or helium (He). In particular, by the n⁻ type drift layer surface being irradiated two times or more under differing irradiation conditions (dose, accelerating voltage, and the like), it is possible to form a point defect region with a high point defect density in a region as far as a predetermined depth from the n⁻ type drift layer surface. This is because, by the inside of the silicon layer being irradiated with the light element at a high energy, the silicon atoms are flicked off the lattice points by elastic collision with the atomic nuclei, and lattice defects (vacancies) are generated. Consequently, by variously changing the light element irradiation conditions, it is possible to control the depth of the point defect region from the n⁻ type drift layer surface. Normally, the point defect introductions have an object of reducing lifetime, but in the invention, a point defect region is formed with an object of enhancing the formation of platinum into an acceptor.

Figure 16:
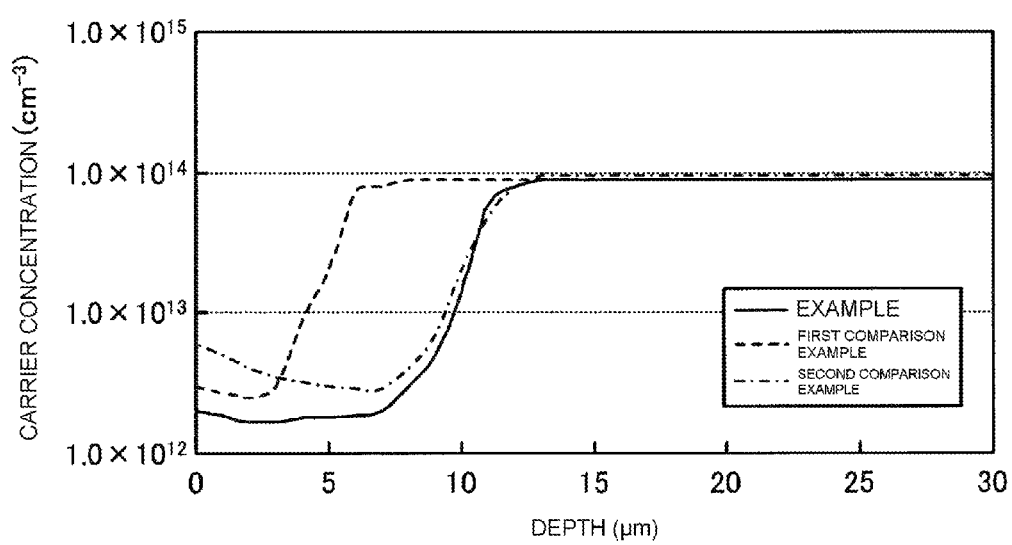
FIG. 16 is a characteristic diagram showing the carrier concentration distribution of the semiconductor device according to the invention.
Figure 17:
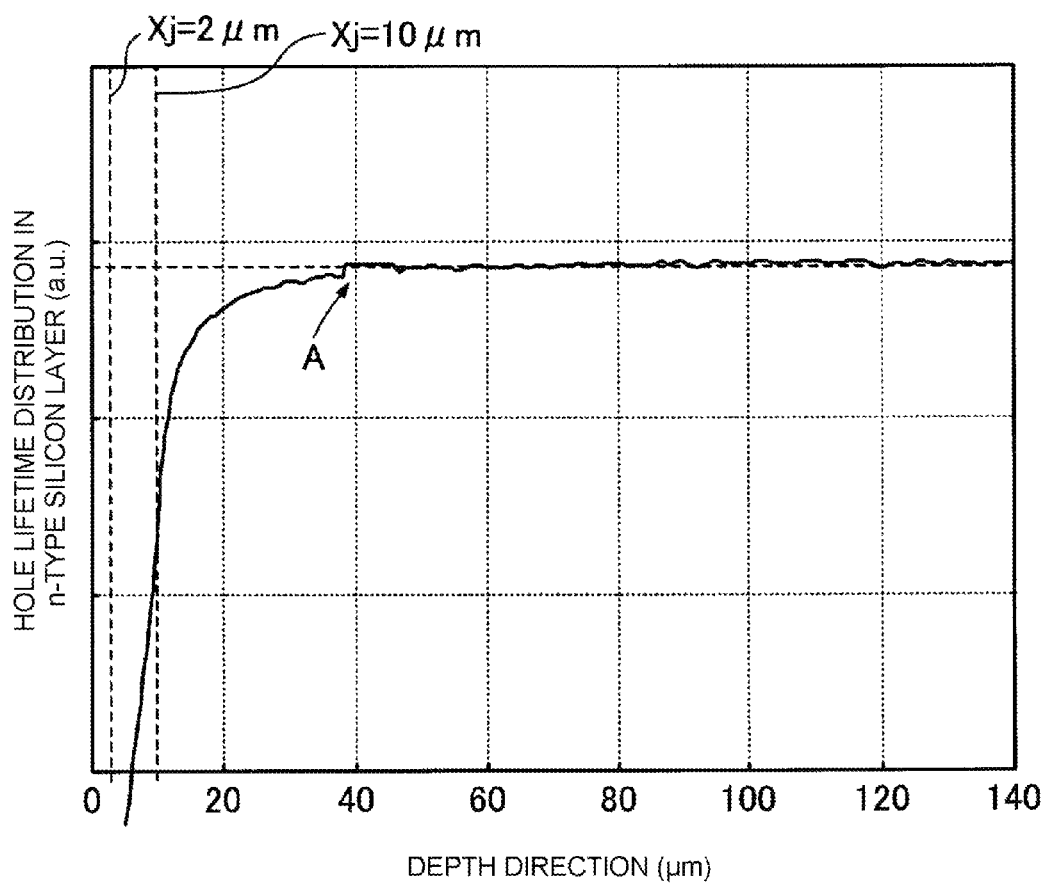
FIG. 17 is a characteristic diagram showing hole lifetime distribution in an n-type silicon layer.
Figure 18:
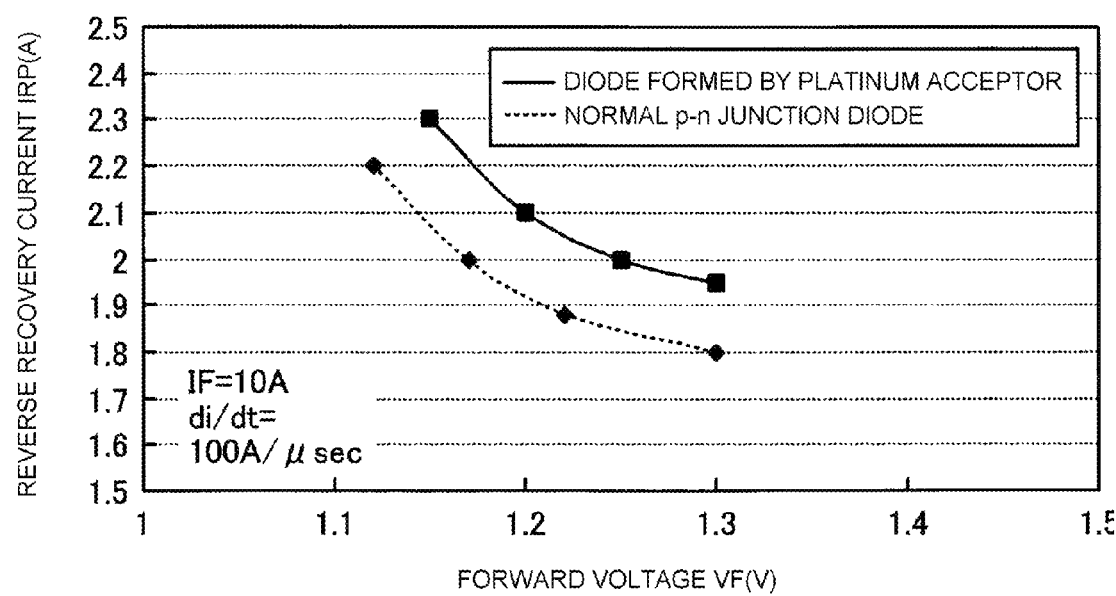
FIG. 18 is a characteristic diagram showing the relationship between forward voltage and reverse recovery current of heretofore known diodes.
Figure 19:
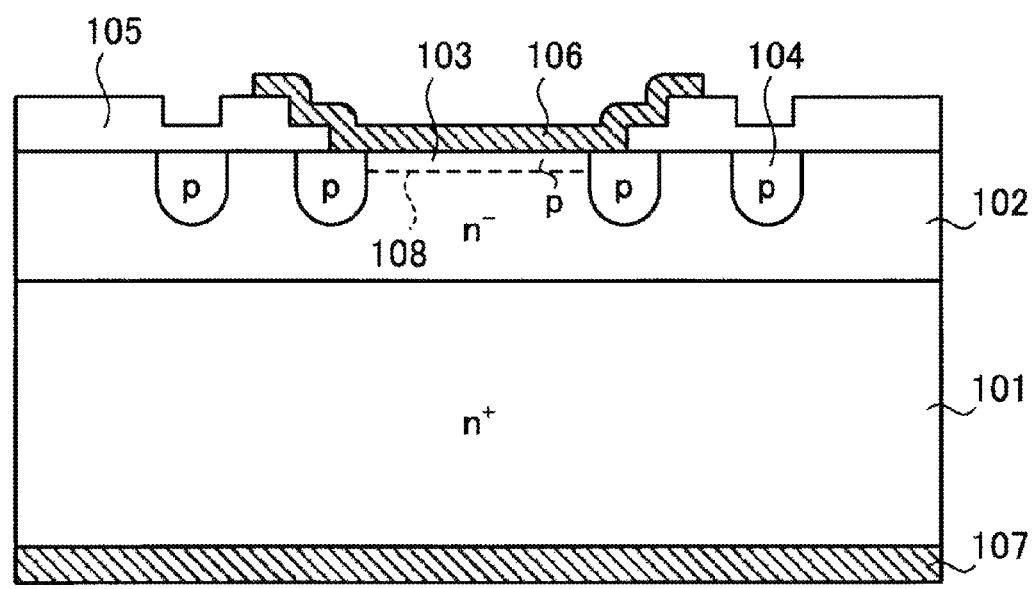
FIG. 19 is a sectional view showing a heretofore known diode structure.
Figure 20:
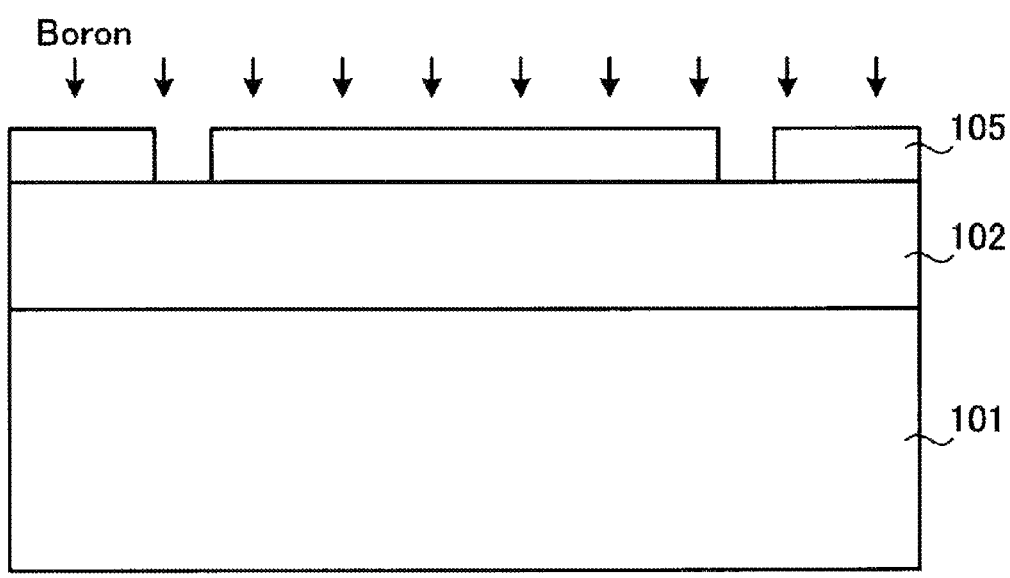
FIG. 20 is a sectional view showing a condition partway through the manufacture of the heretofore known diode.
Figure 21:
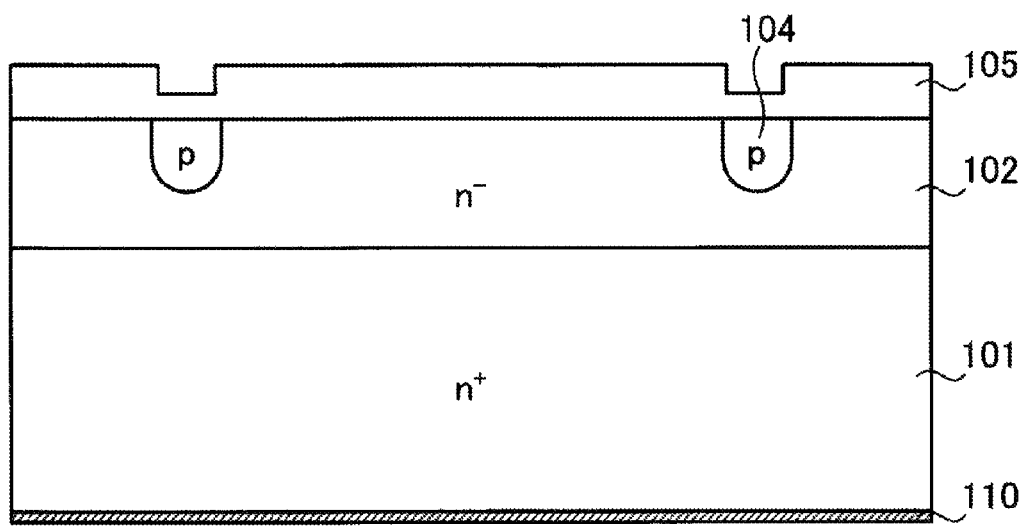
FIG. 21 is a sectional view showing a condition partway through the manufacture of the heretofore known diode.
Figure 22:
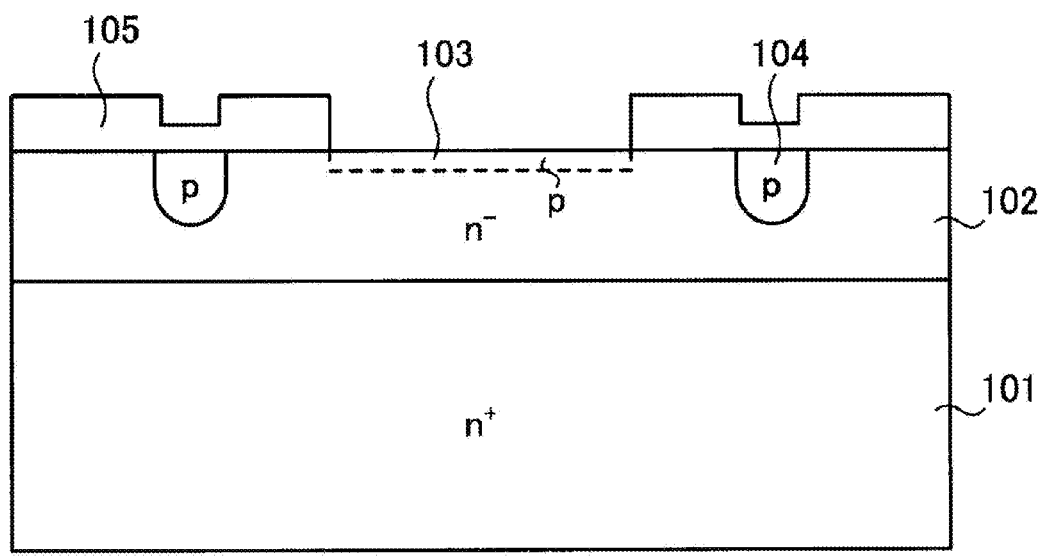
FIG. 22 is a sectional view showing a condition partway through the manufacture of the heretofore known diode.
Figure 23:
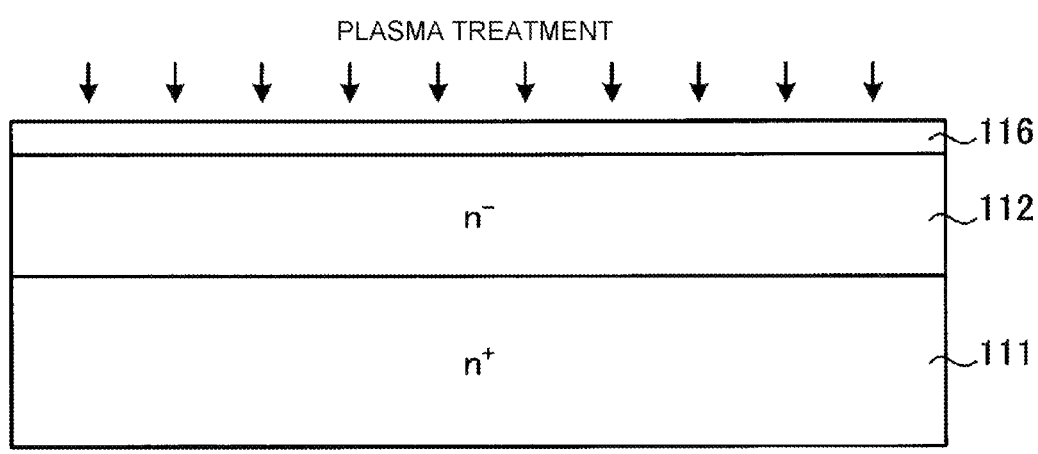
FIG. 23 is a sectional view showing another example of a condition partway through the manufacture of the heretofore known diode.
Figure 24:
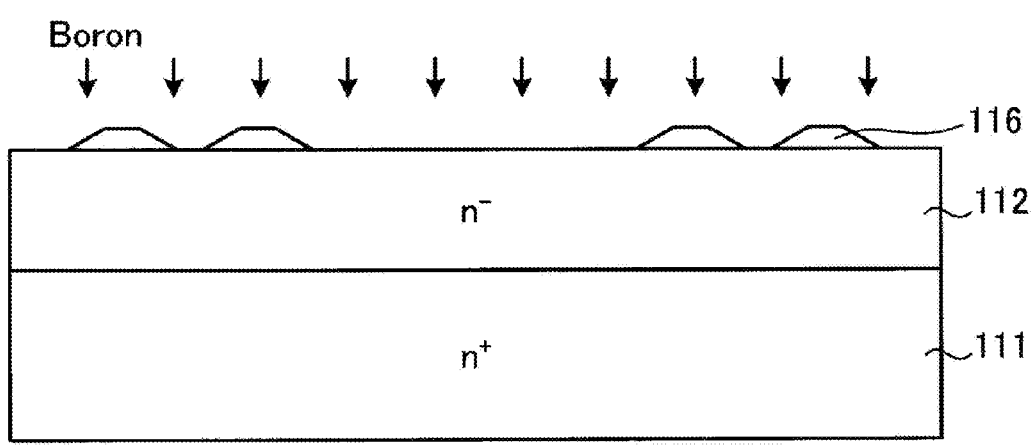
FIG. 24 is a sectional view showing another example of a condition partway through the manufacture of the heretofore known diode.
Figure 25:
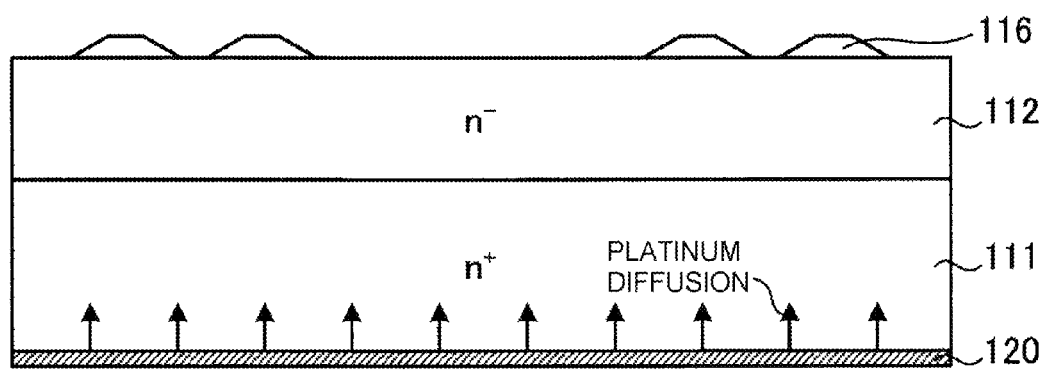
FIG. 25 is a sectional view showing another example of a condition partway through the manufacture of the heretofore known diode.
Figure 26:
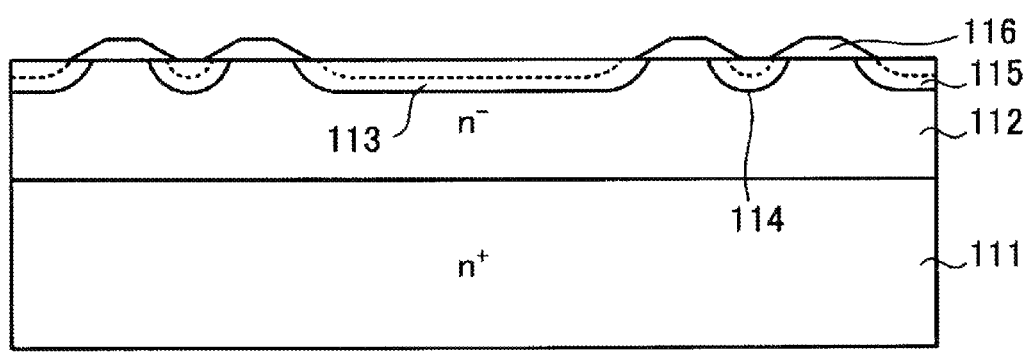
FIG. 26 is a sectional view showing another example of a condition partway through the manufacture of the heretofore known diode.
Figure 27:
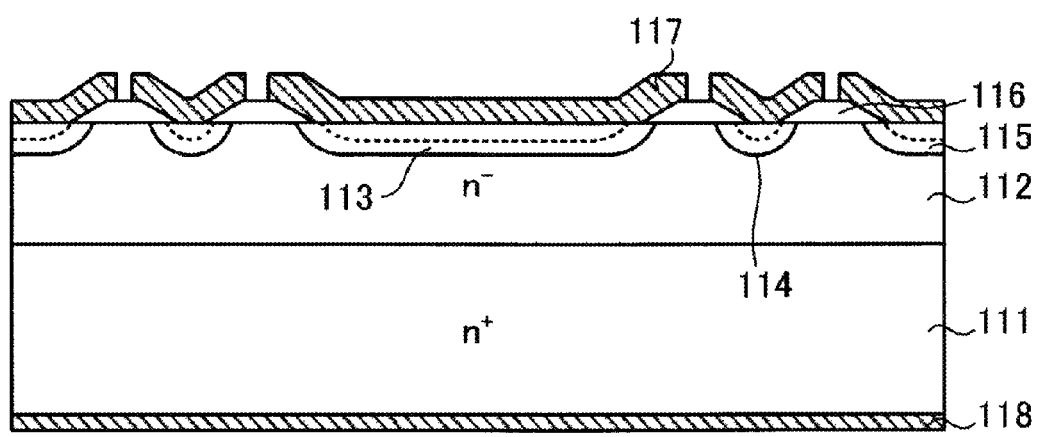
FIG. 27 is a sectional view showing another example of a condition partway through the manufacture of the heretofore known diode.

The depth of the point defect region changes depending on the accelerating voltage of the light element. Because of this, by carrying out successive light element irradiations two times or more at differing accelerating voltages on a region as far as a predetermined depth from the surface of the n⁻ type drift layer, it is possible to form a point defect region distribution such that an excess of point defects are introduced in the depth direction from the n⁻ type drift layer surface. A description will be given of the carrier concentration distribution of the semiconductor device according to the invention when the n⁻ type drift layer is irradiated with proton. FIG. 16 is a characteristic diagram showing the carrier concentration distribution of the semiconductor device according to the invention. FIG. 16 shows the results of the carrier concentration distribution in the vicinity of the surface of the n⁻ type drift layer being measured using a spreading resistance (SR) measurement method after a proton irradiation (in a condition wherein heat treatment has not been performed). In accordance with Embodiment 2, proton irradiation is carried out twice on the n⁻ type drift layer using a tandem Van de Graaff accelerator. The proton dose is fixed at $1 \times 10^{13}/cm^2$, and the accelerating voltage is variously changed.

From the results shown in FIG. 16, it is confirmed that in a first comparison example and second comparison example with an accelerating voltage of 0.5 MeV and an accelerating voltage of 0.75 MeV, the greater the accelerating voltage, the deeper the carrier concentration distribution in the depth direction. Furthermore, it is confirmed that in an example wherein two proton irradiations are carried out successively at an accelerating voltage of 0.5 MeV and an accelerating voltage of 0.75 MeV, as in Embodiment 1, a practically even carrier concentration distribution is formed in the depth direction from the n⁻ type drift layer surface (depth 0 μm). In FIG. 16, a donor concentration reduction caused by the point defect region formed by the proton irradiation is observed. Because of this, it is confirmed that, by carrying out two or more successive light element irradiations at differing accelerating voltages, it is possible to form a point defect region distribution such that an excess of point defects are introduced in the depth direction from the n⁻ type drift layer surface.

According to each embodiment, by platinum being introduced into the point defect region, the platinum moves between crystal lattices formed by silicon atoms (interstitial diffusion), because of which platinum is trapped in the point defects, particularly the vacancies, in the point defect region, and becomes an acceptor that supplies holes. Because of this, it is possible to advance the formation of the platinum into an acceptor in the high concentration point defect region. By controlling the depth of the point defect region so that practically all of the platinum diffused in the n⁻ type drift layer is trapped in point defects introduced to excess into the vicinity of the surface of the n⁻ type drift layer, it is possible to form the p-n junction portion of the p-type inversion enhancement region and n⁻ type drift layer with good controllability. It is desirable that the introduction of platinum is carried out from the n⁻ type drift layer surface.

According to Embodiment 3, even when forming the point defect region after the platinum diffusion, it is possible to cause the platinum to move again and enter the lattice positions by subsequently carrying out heat treatment. Because of this, the platinum becomes an acceptor that supplies holes, and it is possible to enhance the formation of the platinum into an acceptor in the point defect region. With a normal platinum diffusion, the platinum concentration distribution is such that platinum diffuses through the whole of the silicon layer, and in particular, an eccentric location of platinum as far as the vicinity of 60 μm from the n⁻ type drift layer surface is noticeable. This platinum concentration distribution having an inclination in the depth direction is advantageous in improving soft recovery. Further, a combined advantage of this characteristic and the platinum introduced to excess in the vicinity of the n⁻ type drift layer surface can be expected.

As heretofore described, according to the invention, by the end portion form of the mask dielectric (oxide film) of the light element irradiation for introducing the point defects being a tapered form that widens from the upper surface side to the n⁻ type drift layer side, it is possible to change the amount of platinum taken into the mask dielectric in accordance with the thickness of the tapered portion of the mask dielectric. Because of this, it is possible to control the curvature radius of the end portion of the p-type inversion enhancement region. Also, it is possible to change the penetration depth of the light element irradiation from the n⁻ type drift layer surface side using the tapered portion of the mask dielectric. Because of this, it is possible to form the point defect region with a desired point defect density distribution, and with good controllability.

According to the invention, by platinum being introduced into the region in which the point defect region has been introduced, the formation of the platinum into an acceptor is advanced by the point defect region, and it is possible to form the p-type inversion enhancement region formed by the platinum being formed into an acceptor in accordance with the point defect density distribution of the point defect region. Because of this, by controlling the point defect density distribution of the point defect region, it is possible to control the depth of the p-type inversion enhancement region. Because of this, when utilizing the p-type inversion enhancement region as an anode region, it is possible to form a p-n junction portion of the anode region and a drift layer to a predetermined junction depth, stably and with good controllability.

According to the invention, as it is possible to control the depth of the p-type inversion enhancement region and the curvature radius of the end portion, it is possible to set the junction depth of the p-n junction portion of the p-type inversion enhancement region and n⁻ type drift layer so that the trade-off between the forward voltage (on-state voltage) and reverse recovery current is optimal for each device structure. Consequently, it is possible to stably manufacture a diode with excellent reverse bias characteristics including a p-type anode region formed by the formation of platinum into an acceptor.

According to the invention, by using the thick oxide film formed over the whole surface of the n⁻ type drift layer as a mask dielectric of the light element irradiation for introducing the point defects, it is possible to form the p-type anode region of the active region and the p-type guard ring region and p-type channel stopper region of the termination structure region simultaneously. Because of this, it is possible to simplify the semiconductor device manufacturing process. Also, according to the invention, it is possible to easily form the p-type anode layer without carrying out an introduction of a heretofore known dopant impurity (boron, aluminum, or the like) that becomes an acceptor, or a high temperature diffusion at 1,000° C. or more.

In each embodiment, a description has been given with a case wherein the point defect region is introduced by proton irradiation as an example, but the same advantages are also obtained when irradiating with another light element, such as helium. Also, in Embodiments 2 and 3, a description has been given with a case wherein the proton irradiation is carried out twice as an example, but the proton irradiation may also be carried out more than twice. When carrying out the proton irradiation more than twice, it is sufficient that more than two proton irradiations are carried out successively, and the irradiation order can be variously changed regardless of dose or accelerating voltage. Also, a predetermined point defect distribution may be formed by carrying out two or more proton irradiations combining accelerating voltage and irradiation dose as desired.

Also, in each embodiment, a description has been given of a method whereby thermal diffusion is carried out after the application of a silica paste containing platinum on the n⁻ type drift layer surface as an example of a method of introducing platinum, but as it is sufficient that platinum can be diffused in the n⁻ type drift layer, another method may be used. For example, platinum may be diffused in the n⁻ type drift layer by carrying out heat treatment at in the region of 800° C. to 900° C. after forming platinum silicide on the n⁻ type drift layer surface. Also, platinum may be introduced into the n⁻ type drift layer by an ion implantation of platinum from the n⁻ type drift layer surface. When ion implanting platinum, it is assumed that the platinum ions implanted into the n⁻ type drift layer are substituted into acceptor sites during heat treatment at 800° C. to 900° C. carried out after the platinum ion implantation.

Heretofore, the invention has been described with a diode as an example but, the embodiments not being limiting, the invention is applicable to various devices including in an n-type silicon layer a p-type inversion enhancement region wherein the formation of an acceptor is advanced by point defects. For example, the invention is also applicable to a common insulated gate field effect transistor (MOSFET), which is a unipolar device, and to an insulated gate bipolar transistor (IGBT), which is a bipolar device. Also, in each embodiment, the first conductivity type is taken to be an n-type and the second conductivity type a p-type, but the invention is also established in the same way when the first conductivity type is taken to be a p-type and the second conductivity type an n-type.

As heretofore described, the semiconductor device and semiconductor device manufacturing method according to the invention are useful in a power semiconductor device used in a high frequency switching application, or the like.

Thus, a semiconductor device and a method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device manufacturing method, comprising:
    a point defect introduction step of introducing point defects into a surface of a first conductivity type semiconductor layer at a point defect density higher than the point defect density in the semiconductor layer in a state of thermal equilibrium to produce a point defect region;
    a transition metal introduction step of introducing a transition metal into the point defect region; and
    an activation step of using heat treatment to advance the electrical activation of the transition metal in the point defect region, thereby forming a second conductivity type first inversion region,
    wherein each of the point defect region and the second conductivity type first inversion region has an approximately flat concentration distribution in the depth direction.

2. The semiconductor device manufacturing method according to claim 1, wherein the point defect introduction step comprises light element irradiation.

3. The semiconductor device manufacturing method according to claim 2, wherein two or more light element irradiations with differing irradiation conditions are carried out successively.

4. The semiconductor device manufacturing method according to claim 2, further comprising a mask formation step of, before the point defect introduction step, forming on the surface of the semiconductor layer a dielectric mask having a thickness that can control the amount of the light element reaching the semiconductor layer in accordance with the light element irradiation conditions.

5. The semiconductor device manufacturing method according to claim 3, further comprising a mask formation step of, before the point defect introduction step, forming on the surface of the semiconductor layer a dielectric mask having a thickness that can control the amount of the light element reaching the semiconductor layer in accordance with the light element irradiation conditions.

6. The semiconductor device manufacturing method according to claim 4, wherein the mask is formed to have an end portion form which is a tapered form that widens from an upper surface side toward the semiconductor layer side.

7. The semiconductor device manufacturing method according to claim 5, wherein the mask is formed to have an end portion form which is a tapered form that widens from an upper surface side toward the semiconductor layer side.

8. The semiconductor device manufacturing method according to claim 2, wherein the light element is proton or helium.

9. A semiconductor device manufacturing method, comprising:
    a transition metal introduction step of introducing a transition metal into a surface of a first conductivity type semiconductor layer;
    an activation step of using heat treatment to electrically activate the transition metal;
    a point defect introduction step of introducing point defects into the region into which the transition metal has been introduced at a point defect density higher than the point defect density in the semiconductor layer in a state of thermal equilibrium; and
    a reactivation step of using heat treatment to once more electrically activate the transition metal in the region into which the point defects have been introduced after the point defect introduction step,
    wherein the point defect introduction step produces a point defect region, the reactivation step forms a second conductivity type first inversion region, and each of the point defect region and the second conductivity type first inversion region has an approximately flat concentration distribution in the depth direction.

10. The semiconductor device manufacturing method according to claim 9, wherein the point defect introduction step comprises light element irradiation.

11. The semiconductor device manufacturing method according to claim 10, wherein two or more light element irradiations with differing irradiation conditions are carried out successively.

12. The semiconductor device manufacturing method according to claim 10, further comprising a mask formation step of, before the point defect introduction step, forming on the surface of the semiconductor layer a dielectric mask having a thickness that can control the amount of the light element reaching the semiconductor layer in accordance with the light element irradiation conditions.

13. The semiconductor device manufacturing method according to claim 11, further comprising a mask formation step of, before the point defect introduction step, forming on the surface of the semiconductor layer a dielectric mask having a thickness that can control the amount of the light element reaching the semiconductor layer in accordance with the light element irradiation conditions.

14. The semiconductor device manufacturing method according to claim 10, wherein the light element is proton or helium.

* * * * *